United States Patent
Lee et al.

(10) Patent No.: US 7,619,254 B2
(45) Date of Patent: Nov. 17, 2009

(54) THIN FILM TRANSISTOR ARRAY PANEL INCLUDING LAYERED LINE STRUCTURE AND METHOD FOR MANUFACTURING THE SAME

(75) Inventors: Je-Hun Lee, Seoul (KR); Yang-Ho Bae, Suwon-si (KR); Beom-Seok Cho, Seoul (KR); Chang-Oh Jeong, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 11 days.

(21) Appl. No.: 11/228,852

(22) Filed: Sep. 16, 2005

(65) Prior Publication Data

US 2006/0102907 A1 May 18, 2006

(30) Foreign Application Priority Data

Nov. 17, 2004 (KR) ............ 10-2004-0093887

(51) Int. Cl.
H01L 27/14 (2006.01)
H01L 29/04 (2006.01)
H01L 29/15 (2006.01)
H01L 31/036 (2006.01)

(52) U.S. Cl. .......................... 257/72; 257/59
(58) Field of Classification Search .............. 257/72
See application file for complete search history.

(56) References Cited

U.S. PATENT DOCUMENTS 6,444,296 B1    9/2002   Sasaki et al.
6,573,127 B2    6/2003   Seo
6,649,936 B1   11/2003   Sung et al.
6,750,475 B1 *  6/2004   Izumi et al. ............. 257/59
2004/0178411 A1 * 9/2004  Misaki et al. ........... 257/72
2006/0151788 A1 * 7/2006  Cho et al. .............. 257/72
2006/0163582 A1 * 7/2006  Lee et al. .............. 257/66

FOREIGN PATENT DOCUMENTS

| CN | 1183570 A   | 6/1998 |
| JP | 8-18058     | 1/1996 |
| JP | 11-283934   | 10/1999 |
| JP | 2000-077806 | 3/2000 |
| JP | 2000-330134 | 11/2000 |

(Continued)

OTHER PUBLICATIONS

Machine Translation of KR 10-2004-0062163.*

(Continued)

*Primary Examiner*—Kenneth A Parker
*Assistant Examiner*—Anthony Ho
(74) *Attorney, Agent, or Firm*—Innovation Counsel LLP

(57) ABSTRACT

The present invention provides a thin film transistor array panel comprising an insulating substrate; a gate line formed on the insulating substrate; a gate insulating layer formed on the gate line; a drain electrode and a data line having a source electrode formed on the gate insulating layer, the drain electrode being adjacent to the source electrode with a gap therebetween; and a pixel electrode coupled to the drain electrode, wherein at least one of the gate line, the data line, and the drain electrode comprises a first conductive layer comprising a conductive oxide and a second conductive layer comprising copper (Cu).

9 Claims, 34 Drawing Sheets

FOREIGN PATENT DOCUMENTS

| | | |
|---|---|---|
| KR | 10-0161325 | 8/1998 |
| KR | 10-0164654 | 9/1998 |
| KR | 10-0269521 | 7/2000 |
| KR | 2000-0040732 | 7/2000 |
| KR | 2001-0011390 | 2/2001 |
| KR | 10-0303141 | 7/2001 |
| KR | 2002-0017438 | 3/2002 |
| KR | 2002-0017440 | 3/2002 |
| KR | 2002-0074302 | 9/2002 |
| KR | 10-0357218 | 10/2002 |
| KR | 10-0437820 | 6/2004 |
| KR | 10-2004-0062163 | 7/2004 |
| WO | WO 2004047159 A1 * | 6/2004 |
| WO | WO 2004061991 A1 * | 7/2004 |

OTHER PUBLICATIONS

Machine Translation of KR 10-2000-0040732.*

Machine Translation of KR 10-0303141.*

English Language Abstract, KR Patent Publication No. 10-0269521, Jul. 20, 2000, 1 page.

English Language Abstract, KR Patent Publication No. 2000-0040732, Jul. 5, 2000, 1 page.

English Language Abstract, KR Patent Publication No. 2001-0011390, Feb. 15, 2001, 1 page.

English Language Abstract, KR Patent Publication No. 10-0303141, Jul. 9, 2001, 1 page.

English Language Abstract, KR Patent Publication No. 2002-0017438, Mar. 7, 2002, 1 page.

English Language Abstract, KR Patent Publication No. 2002-0017440, Mar. 7, 2002, 1 page.

English Language Abstract, KR Patent Publication No. 2002-0074302, Sep. 30, 2002, 1 page.

English Language Abstract, KR Patent Publication No. 10-0357218, Oct. 4, 2002, 1 page.

English Language Abstract, KR Patent Publication No. 10-0437820, Jun. 17, 2004, 1 page.

English Language Abstract, KR Patent Publication No. 10-2004-0062163, Jul. 7, 2004, 1 page.

English Language Abstract, JP Patent Publication No. 08-018058, Jan. 16, 1996, 1 page.

English Language Abstract, JP Patent Publication No. 08-018058, Jan. 19, 1996, 1 page (corresponding to KR 10-0161329).

English Language Abstract, DE Patent Publication No. 19546962, Feb. 1, 1999, 1 page (corresponding to KR 10-0164654).

English Language Abstract, JP Patent Publication No. 11-283934, Oct. 15, 1999, 1 page.

English Language Abstract, JP Patent Publication No. 2000-077806, Mar. 14, 2000, 1 page.

English Language Abstract, JP Patent Publication No. 2000-330134, Nov. 30, 2000, 1 page.

* cited by examiner

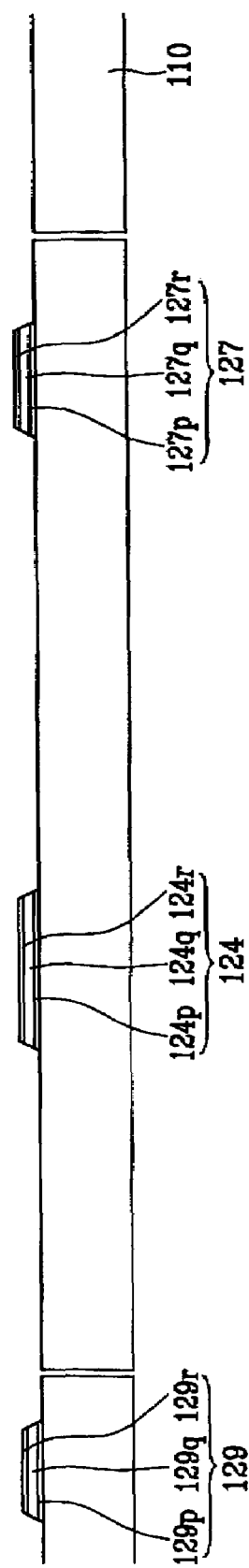

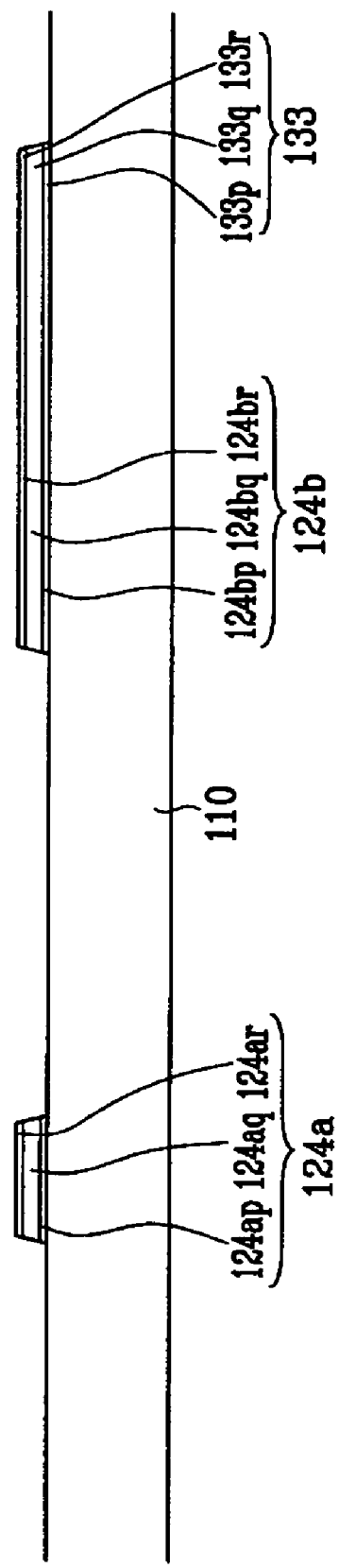

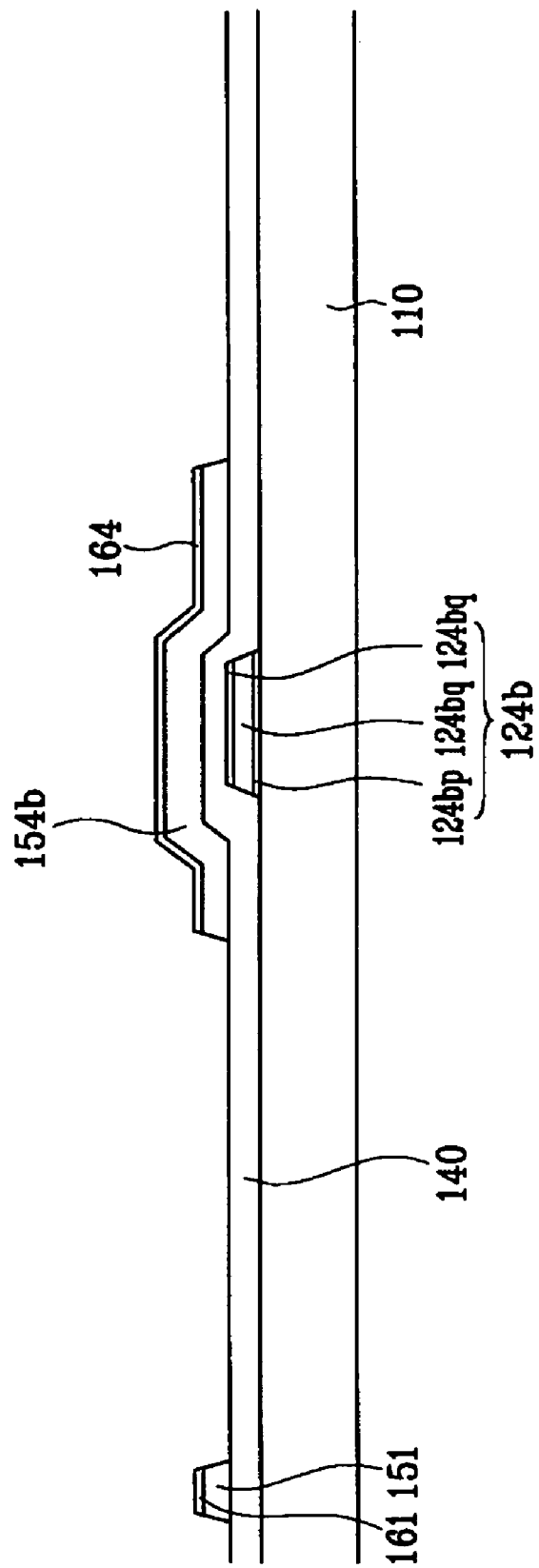

THIN FILM TRANSISTOR ARRAY PANEL INCLUDING LAYERED LINE STRUCTURE AND METHOD FOR MANUFACTURING THE SAME

CROSS-REFERENCE TO RELATED APPLICATIONS

This application claims priority under 35 U.S.C. § 119 to Korean Patent Application No. 10-2004-0093887, filed Nov. 17, 2004 in the Korean Intellectual Patent Office (KIPO), the contents of which is herein incorporated by reference in its entirety.

BACKGROUND (a) Field of the Invention

The present description relates to a thin film transistor (TFT) array panel for a liquid crystal display (LCD) or an organic light emitting display (OLED), and a manufacturing method for the same.

(b) Description of the Related Art

Liquid crystal displays (LCDs) are one of the most widely used flat panel displays. An LCD includes a liquid crystal (LC) layer interposed between two panels provided with field-generating electrodes. The LCD displays images by applying voltages to the field-generating electrodes to generate an electric field in the LC layer that determines orientations of LC molecules therein to adjust the polarization of incident light.

An LCD including two panels provided with field-generating electrodes respectively, wherein one panel has a plurality of pixel electrodes in a matrix and the other has a common electrode covering the entire surface of the panel, dominates the LCD market.

The LCD displays images by applying a different voltage to each pixel electrode. For this purpose, thin film transistors (TFTs) having three terminals to switch voltages applied to the pixel electrodes are connected to the pixel electrodes, and gate lines to transmit signals for controlling the thin film transistors and data lines to transmit voltages applied to the pixel electrodes, are formed on a thin film transistor array panel.

A TFT is a switching element for transmitting image signals from the data line to the pixel electrode in response to the scanning signals from the gate line.

The TFT is applied to an active matrix organic light emitting display as a switching element for controlling respective light emitting elements.

Meanwhile, chromium (Cr) is conventionally the dominating material for the gate lines and the data lines of a TFT array panel.

Considering the trend of LCDs of increasing size, a material having low resistivity is urgently required since the lengths of the gate and data lines increase along with the LCD size. Accordingly, there are limitations to applying Cr to a large size LCD.

Cu is a well-known substitute for Cr due to its low resistivity. However, the poor adhesiveness of Cu with a glass substrate and the difficulty in etching Cu are obstacles in applying Cu for use with gate and data lines.

SUMMARY

Accordingly, it would be desirable to solve the above mentioned problems and to provide a thin film transistor array panel that has signal lines having low resistivity and good reliability.

In accordance with the present invention, a thin film transistor array panel is provided. The thin film transistor array panel comprises an insulating substrate; a gate line formed on the insulating substrate; a gate insulating layer formed on the gate line; a drain electrode and a data line having a source electrode formed on the gate insulating layer, the drain electrode being adjacent to the source electrode with a gap therebetween; and a pixel electrode coupled to the drain electrode, wherein at least one of the gate line, the data line, and the drain electrode comprises a first conductive layer comprising a conductive oxide and a second conductive layer comprising copper (Cu).

Here, the first conductive layer contains at least one material selected from ITO, ITON, IZO, and IZON.

In accordance with the present invention, a manufacturing method of a thin film transistor array panel is provided. The manufacturing method comprises: forming a gate line having a gate electrode on an insulating substrate; depositing a gate insulating layer and a semiconductor layer on the gate line in sequence; forming a drain electrode and a data line having a source electrode on the gate insulating layer and the semiconductor layer, the drain electrode being adjacent to the source electrode with a gap therebetween; and forming a pixel electrode coupled to the drain electrode, wherein at least one step of the forming the gate line and the forming the data line and drain electrode comprises forming a conductive oxide layer and forming a conductive layer containing Cu.

At least one step of the forming a gate line and the forming a data line and drain electrode may comprise a step of forming a conductive oxide layer after forming a conductive layer containing Cu.

The conductive oxide layer may comprise IZO or ITO.

The step of forming the conductive oxide layer may comprise exposing the conductive oxide layer to a nitrogen-containing gas.

The step of forming the conductive oxide layer may comprise exposing the conductive oxide material to at least one of hydrogen ($H_2$) and water vapor ($H_2O$).

The step of forming the conductive oxide layer may be performed at a temperature between 25° C. to 150° C.

BRIEF DESCRIPTION OF THE DRAWINGS

FIG. 3B is a sectional view of the TFT array panel shown in FIG. 3A taken along the line IIIb-IIIb';

FIGS. 10A and 10B are sectional views of the TFT array panel shown in FIG. 9 taken along the lines Xa-Xa' and Xb-Xb';

FIGS. 12A and 12B are sectional views of the TFT array panel shown in FIG. 11 taken along the lines XIIa-XIIa' and XIIb-XIIb';

DETAILED DESCRIPTION OF THE PREFERRED EMBODIMENTS

Figure 1:
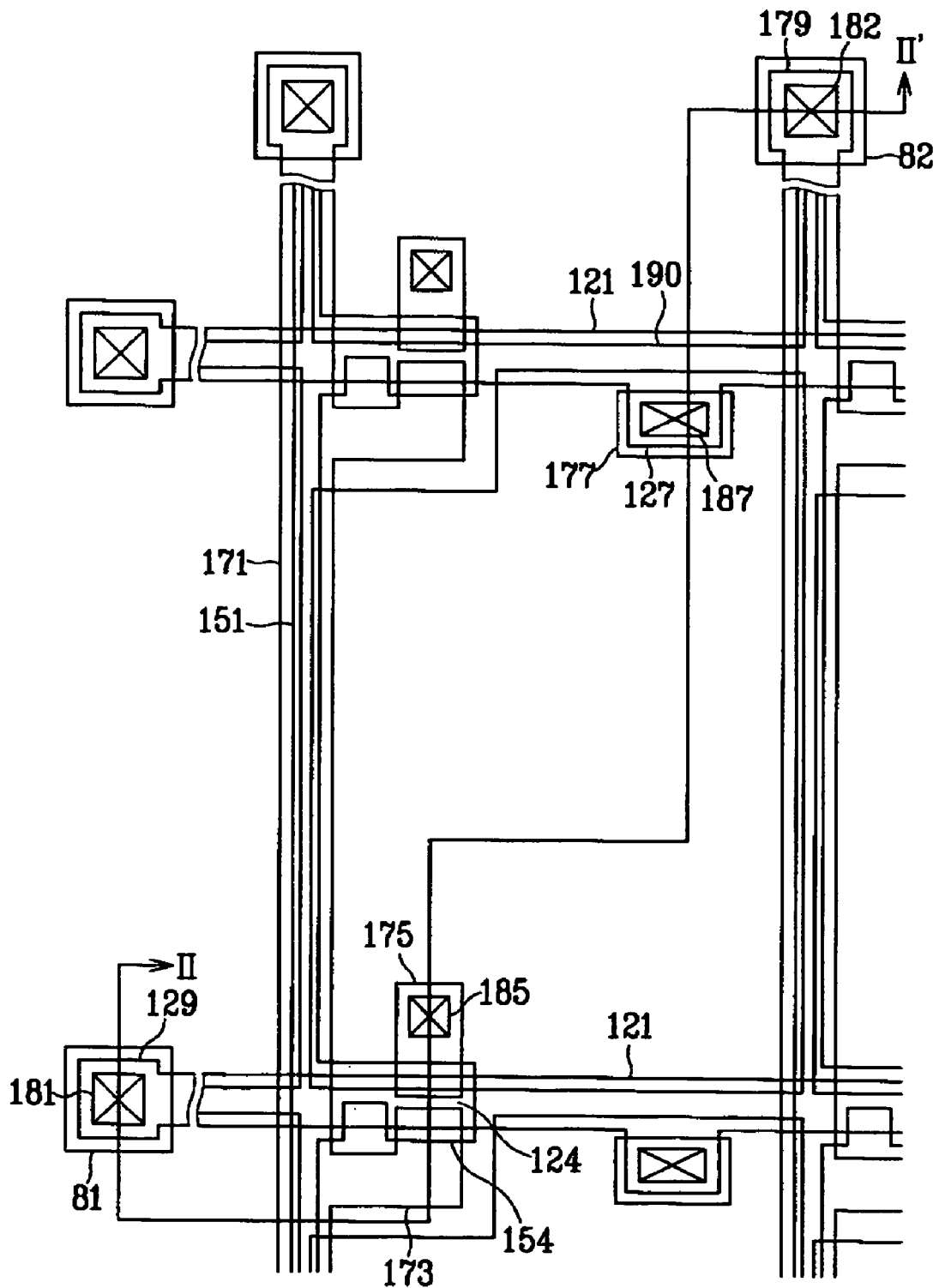
FIG. 1 is a layout view of a TFT array panel for an LCD according to an embodiment of the present invention.

Preferred embodiments of the present invention will now be described more fully hereinafter with reference to the accompanying drawings, in which preferred embodiments of the invention are shown. The present invention may, however, be embodied in different forms and should not be construed as being limited to the embodiments set forth herein. Rather, these embodiments are provided so that this disclosure will be thorough and complete, and will fully convey the scope of the invention to those skilled in the art.

In the drawings, the thicknesses of layers, films, and regions are exaggerated for clarity. Like numerals refer to like elements throughout. It will be understood that when an element such as a layer, film, region, or substrate is referred to as being "on" another element, it can be directly on the other element or intervening elements may also be present.

Now, TFT array panels for an LCD and an OLED and manufacturing methods thereof according to embodiments of this invention will be described in detail with reference to the accompanying drawings.

Embodiment 1

First, a TFT array panel for an LCD according to an embodiment of the present invention will be described in detail with reference to FIGS. 1 and 2.

Figure 2:
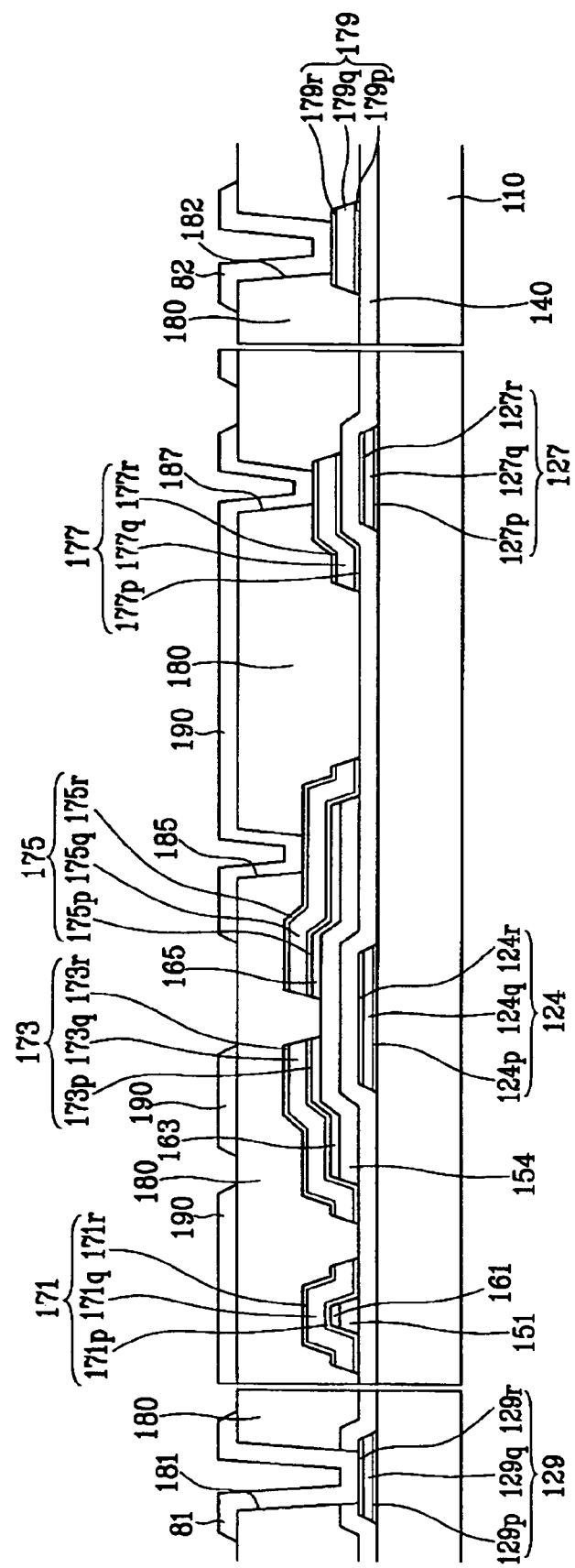
FIG. 2 is a sectional view of the TFT array panel shown in FIG. 1 taken along the line II-II.

FIG. 1 is a layout view of a TFT array panel for an LCD according to an embodiment of the present invention, and FIG. 2 is a sectional view of the TFT array panel shown in FIG. 1 taken along the line II-II.

A plurality of gate lines 121 for transmitting gate signals are formed on an insulating substrate 110. The gate lines 121 are primarily formed in the horizontal direction and partial portions thereof form a plurality of gate electrodes 124. Also, different partial portions thereof that extend in a lower direction form a plurality of expansions 127. An end portion 129 of the gate line 121 has an expanded width for connection with an external device such as driving circuit.

The gate line 121 has first layers 124p, 127p, and 129p and second layers 124q, 127q, and 129q, and third layers 124r, 127r, and 129r. The first layers 124p, 127p, and 129p comprise a conductive oxide such as ITO (indium tin oxide) or IZO (indium zinc oxide) and are formed on the substrate 110. The second layers 124q, 127q, and 129q comprise a Cu-containing metal such as Cu and a Cu alloy formed on the first layers 124p, 127p, and 129p. The third layers 124r, 127r, and 129r comprise a conductive oxide such as ITO or IZO formed on the second layers 124q, 127q, and 129q.

Here, the third layers 124r, 127r, and 129r prevent the Cu of the second layers 124q, 127q, and 129q from diffusing into a gate insulating layer 140 formed thereon.

When a conductive oxide layer is disposed between a Cu layer and a substrate, adhesiveness between the Cu layer and the substrate is enhanced to prevent the Cu layer from peeling and lifting.

When the conductive oxide layer comprises amorphous ITO, adhesiveness between the Cu layer and the substrate is significantly more enhanced. This is because the amorphous ITO layer formed at a low temperature subsequently undergoes a high temperature of about 200° C. during the formation of the gate insulating layer 140 and a semiconductor layer 151, thereby resulting in the crystallization of the ITO layer.

A Cu layer and a conductive oxide layer, such as an ITO layer or an IZO layer, can be etched by the same etching process. Since Cu is strongly affected by acid, it is etched very rapidly when exposed thereto. Accordingly, a weak acid is generally used to etch a Cu layer. However, since other metals, such as Mo, Cr, and Ti, are etched much more slowly than Cu, when such metals are applied as an underlayer of the Cu layer, two different etching conditions are applied to pattern those layers. In contrast, since the amorphous ITO or IZO is etched along with the Cu layer by the same etching process, they are simultaneously patterned to form the gate line 121.

The first layers 124p, 127p, and 129p and the third layers 124r, 127r, and 129r may comprise an ITON layer or IZON layer to prevent oxidation of Cu at the interfaces of the second layers 124q, 127q, and 129q, the first layers 124p, 127p, and 129p, and the third layers 124r, 127r, and 129r. The ITON layer or IZON layer is formed by exposing the ITO layer or IZO layer to a nitrogen atmosphere and prevents a rapid increase of resistance due to Cu oxidation.

The lateral sides of the third layers 124r, 127r, and 129r, the second layers 124q, 127q, and 129q, and the first layers 124p, 127p, and 129p are inclined relative to a surface of the substrate 110, and the inclination angle thereof ranges from about 30 to 80 degrees.

A gate insulating layer 140 preferably comprising silicon nitride ($SiN_x$) is formed on the gate lines 121.

A plurality of semiconductor stripes 151, preferably comprising hydrogenated amorphous silicon (abbreviated to "a-Si"), are formed on the gate insulating layer 140. Each semiconductor stripe 151 extends substantially in the longitudinal direction and is curved periodically. Each semiconductor stripe 151 has a plurality of projections 154 branching out toward the gate electrodes 124. The width of each semiconductor stripe 151 becomes larger near the gate lines 121 such that the semiconductor stripe 151 covers large areas of the gate lines 121.

A plurality of ohmic contact stripes 161 and islands 165, preferably comprising silicide or n+hydrogenated a-Si heavily doped with an n-type impurity, are formed on the semiconductor stripes 151. Each ohmic contact stripe 161 has a plurality of projections 163, and the projections 163 and the ohmic contact islands 165 are located in pairs on the projections 154 of the semiconductor stripes 151.

The lateral sides of the semiconductor stripes 151 and the ohmic contacts 161 and 165 are tapered, and the inclination angles of the lateral sides of the semiconductor stripes 151 and the ohmic contacts 161 and 165 are preferably in a range of about 30-80 degrees.

A plurality of data lines 171, a plurality of drain electrodes 175, and a plurality of storage capacitor conductors 177 are formed on the ohmic contacts 161 and 165 and the gate insulating layer 140.

The data lines 171, for transmitting data voltages, extend substantially in the longitudinal direction and intersect the gate lines 121 to define pixel areas arranged in a matrix. Each data line 171. has a plurality of branches which project toward the drain electrodes 175, forms a plurality of source electrodes 173, and has an end portion 179 having an enlarged width. Each pair of the source electrodes 173 and the drain electrodes 175 are separated from each other at the gate electrodes 124, and oppose each other.

The data line 171, the drain electrode 175, and the storage capacitor conductor 177 have first layers 171p, 175p, and 177p, second layers 171q, 175q, and 177q, and third layers 171r, 175r, and 177r. The first layers 171p, 175p, and 177p and the third layers 171r, 175r, and 177r are respectively disposed at lower and upper sides of the second layers 171q, 175q, and 177q. The first layers 171p, 175p, and 177p and the third layers 171r, 175r, and 177r comprise a conductive oxide. The second layers 171q, 175q, and 177q comprise a Cu containing metal, such as Cu or a Cu alloy.

The first layers 171p, 175p, and 177p and the third layers 171r, 175r, and 177r may comprise ITO or IZO. Here the first layers 171p, 175p, and 177p and the third layers 171r, 175r, and 177r of a conductive oxide prevent Cu of the second layers 171q, 175q, and 177q from diffusing into the semiconductor layer 151 and a pixel electrode 190 formed thereon. When the conductive oxide layer comprises ITO, amorphous ITO is preferable. Since the amorphous ITO or IZO is etched along with Cu by the same etching process, they are simultaneously patterned to form the data lines 171 having a smooth profile without undercutting. The first layers 171p, 175p, and 177p and the third layers 171r, 175r, and 177r preferably comprise an ITON layer or IZON layer to prevent oxidation of Cu at the interface of the second layers 171q, 175q, and 177q and the first and third layers 171p, 175p, 177p, 171r, 175r, and 177r. The ITON layer or IZON layer is formed by exposing the ITO layer or IZO layer to a nitrogen atmosphere, and helps to prevent a rapid increase of resistance due to Cu oxidation.

A gate electrode 124, a source electrode 173, and a drain electrode 175, along with a projection 154 of a semiconductor stripe 151, forms a TFT having a channel formed in the projection 154 disposed between the source electrode 173 and the drain electrode 175. The storage capacitor conductor 177 overlaps with the expansion 127 of the gate line 121.

The data lines 171, the drain electrodes 175, and the storage capacitor conductor 177 have tapered lateral sides, and the inclination angles of the lateral sides are in a range of about 30-80 degrees.

The ohmic contacts 161 and 165 are only interposed between the semiconductor stripe 151 and the data line 171 and between the drain electrode 175 and the projection 154 of the semiconductor stripe 151 in order to reduce contact resistance therebetween.

The semiconductor stripe 151 is partially exposed at the location between the source electrode 173 and the drain electrode 175 and at the other places not covered by the data line 171 and the drain electrode 175. Most of the semiconductor stripe 151 is narrower than the data line 171, but the width of the semiconductor stripe 151 broadens near a location where the semiconductor stripe 151 and the gate line 121 meet each other in order to prevent disconnection of the data line 171.

On the data line 171, the drain electrode 175, the storage capacitor conductor 177, and the exposed region of the semiconductor stripe 151, a passivation layer 180 is provided, which comprises an organic material having substantial planarization properties and photosensitivity or an insulating material with a low dielectric constant, such as a-Si:C:O, a-Si:O:F, etc. This passivation layer 180 may be formed by plasma enhanced chemical vapor deposition (PECVD). To prevent the organic material of the passivation layer 180 from contacting the semiconductor stripes 151 exposed between the data line 171 and the drain electrode 175, the passivation layer 180 can be structured in a way that an insulating layer made of $SiN_x$ or $SiO_2$ is additionally formed under the organic material layer.

In the passivation layer 180, a plurality of contact holes 181, 185, 187, and 182 are formed to expose an end portion 129 of the gate line 121, the drain electrode 175, the storage capacitor conductor 177, and an end portion 179 of the data line 171, respectively.

A plurality of pixel electrodes 190 and a plurality of contact assistants 81 and 82, which comprise IZO or ITO, are formed on the passivation layer 180.

Since the pixel electrode 190 is physically and electrically connected with the drain electrode 175 and the storage capacitor conductor 177 through the contact holes 185 and 187, respectively, the pixel electrode 190 receives the data voltage from the drain electrodes 175 and transmits it to the storage capacitor conductor 177.

The pixel electrode 190 to which the data voltage is applied generates an electric field with a common electrode (not illustrated) of the opposite panel (not illustrated) to which a common voltage is applied, so that the liquid crystal molecules in the liquid crystal layer are rearranged.

Also, as mentioned above, the pixel electrode 190 and the common electrode form a capacitor to store and preserve the received voltage after the TFT is turned off. This capacitor will be referred to as a "liquid crystal capacitor." To enhance the voltage storage capability, another capacitor is provided, which is connected with the liquid crystal capacitor in parallel and will be referred to as a "storage capacitor." The storage capacitor is formed at an overlapping portion of the pixel electrode 190 and the adjacent gate line 121, which will be referred to as the "previous gate line." The expansion 127 of the gate line 121 is provided to ensure the largest possible overlap area and thus to increase the storage capacity of the storage capacitor. The storage capacitor conductor 177 is connected to the pixel electrode 190 and overlaps with the expansion 127, and is provided below the passivation layer 180 so that the pixel electrode 190 is in close proximity to the previous gate line 121.

The contact assistants 81 and 82 are respectively connected to the end portions 129 and 179 of the gate line 121 and the data line 171. The contact assistants 81 and 82 respectively provide protection and supplement adhesion between the end portion 129 of the gate line 121 and the exterior devices, such as the driving integrated circuit, and between the end portion 179 of the data line 171 and the exterior devices. Applying the contact assistants 81 and 82 is optional since they are not essential elements.

A method of manufacturing a TFT array panel will be now described in detail with reference to FIGS. 3A to 6B as well as FIGS. 1 and 2.

Figure 3A:
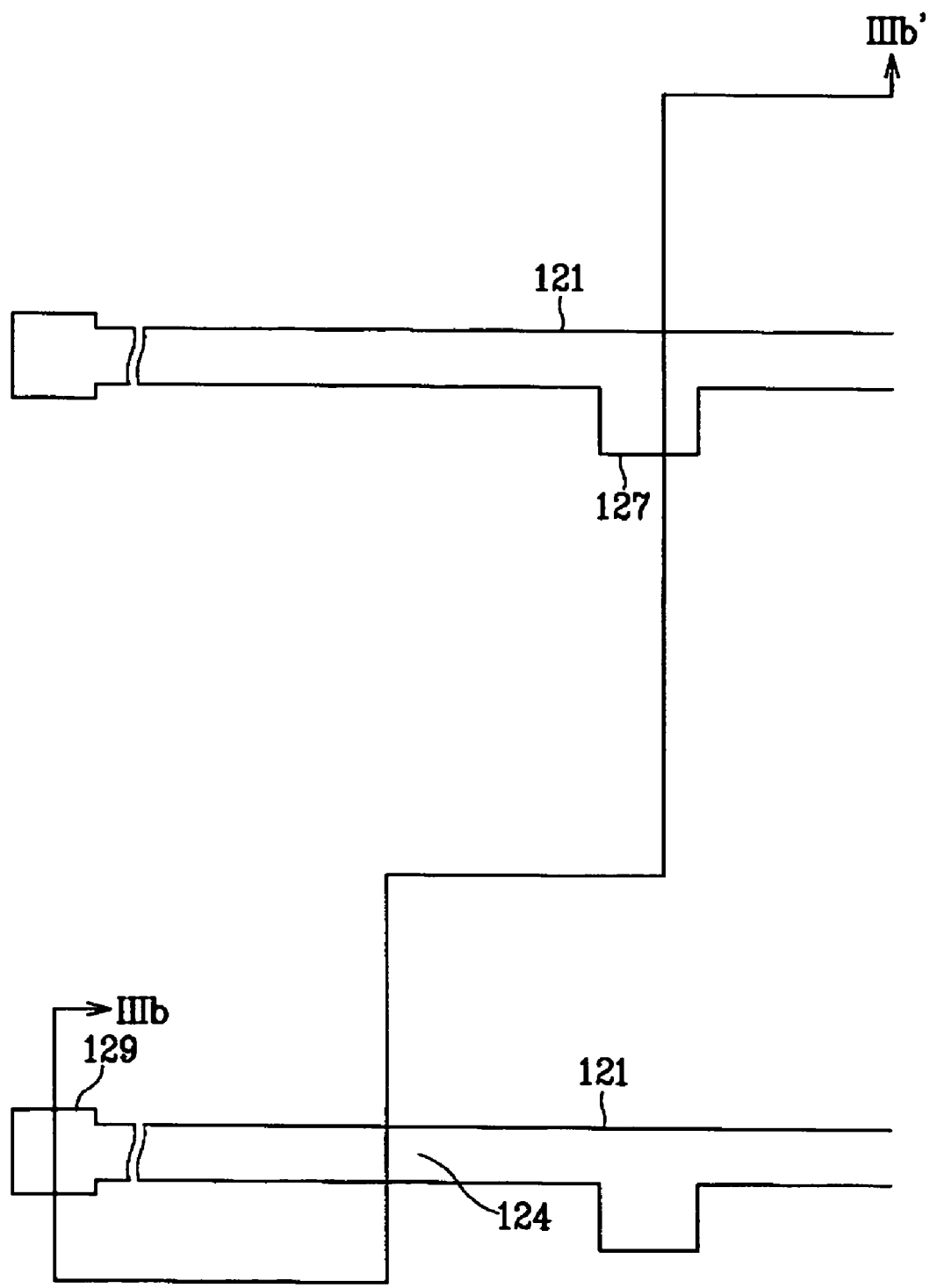
FIGS. 3A, 4A, 5A, and 6A are layout views sequentially illustrating the intermediate steps of a method of manufacturing a TFT array panel for an LCD according to the embodiment of FIGS. 1 and 2.

At first, as shown in FIGS. 3A and 3B, a first layer of a conductive oxide, such as ITO or IZO, a second layer of a Cu-containing metal, and a third layer of a conductive oxide, such as ITO or IZO, are formed on an insulating substrate 110.

The first layer and the second layer may be deposited by co-sputtering. Two targets are installed in the same sputtering chamber for the co-sputtering. One target comprises a conductive oxide, such as ITO or IZO. The other target comprises a Cu-containing metal, such as Cu or a Cu-alloy. Hereinafter, examples of an ITO target and a Cu target will be described.

The co-sputtering is performed as follows.

At first, in order to deposit a first ITO layer, power is applied to the ITO target while no power is applied to the Cu target. The sputtering is performed at a temperature between 25° C. and 150° C. while supplying hydrogen gas ($H_2$) or water vapor ($H_2O$). Such conditions result in the formation of an amorphous ITO layer. The ITO layer has a thickness of 50 Å to 500 Å.

Next, a Cu layer is deposited by switching the power to be applied to the Cu target and not to be applied to the ITO target. The Cu layer has a thickness of 50 Å to 2,000 Å.

Next, a second ITO layer is deposited by switching the power to be applied again to the ITO target and not to be applied to the Cu target. The sputtering is performed at a temperature between 25° C. and 150° C. while supplying hydrogen gas ($H_2$) or water vapor ($H_2O$). Such conditions result in the formation of an amorphous ITO layer. The second ITO layer has a thickness of 50 Å to 500 Å.

Nitrogen gas ($N_2$), nitrous oxide ($N_2O$), or ammonia ($NH_3$) may be applied while sputtering the ITO target to form an ITON layer.

When a conductive oxide layer is disposed between a Cu layer and a substrate, adhesiveness between the Cu layer and the substrate is enhanced. The conductive oxide layer applied on top of the Cu layer prevents the Cu from diffusing into a gate insulating layer 140 which will be formed thereon.

When the conductive oxide layer comprises amorphous ITO, adhesiveness between the Cu layer and the substrate 110 is significantly enhanced. This is because the amorphous ITO layer formed at a low temperature undergoes a high temperature of about 200° C. during the formation of the gate insulating layer 140 and a semiconductor layer 151, thereby resulting in the crystallization of the ITO layer.

An amorphous ITO layer or an amorphous IZO layer can be etched by a weak acid. Since Cu is strongly affected by an acid, it is etched very fast therewith. Accordingly, a weak acid is generally used to etch a Cu layer. However, since other metals such as Mo, Cr, and Ti are etched much more slowly than Cu, when such metals are applied as an underlayer of the Cu layer, two different etching conditions are applied to pattern those layers. In contrast, since the amorphous ITO or IZO can be etched along with the Cu layer by a weak acid, the layers can be simultaneously patterned to form the gate line 121.

As in the above descriptions, when an amorphous ITO or IZO layer is disposed between a Cu layer and a substrate, the adhesiveness between the Cu layer and the substrate and etching efficiency is enhanced. The amorphous ITO or IZO layer prevents diffusion of Cu to other layers.

When nitrogen gas ($N_2$), nitrous oxide ($N_2O$), or ammonia ($NH_3$) is supplied during sputtering of the ITO or IZO target, an ITON or IZON layer is formed to prevent oxidation of the Cu layer at the interface.

Then, a photoresist is coated on the second ITO layer and is illuminated with a light through a photo-mask. Next, the illuminated photoresist is developed.

The two ITO layers and the Cu layer are simultaneously etched to form a plurality of gate lines 121 using an etchant, such as, e.g., hydrogen peroxide ($H_2O_2$) or a common etchant containing an appropriate amount of phosphoric acid ($H_2PO_3$), nitric acid ($HNO_3$), and acetic acid ($CH_3COOH$).

Through the above-described processes, as shown in FIGS. 3A and 3B, a plurality of gate lines 121 having a plurality of gate electrodes 124, expansions 127, and end portions 129 are formed.

Figure 4A:
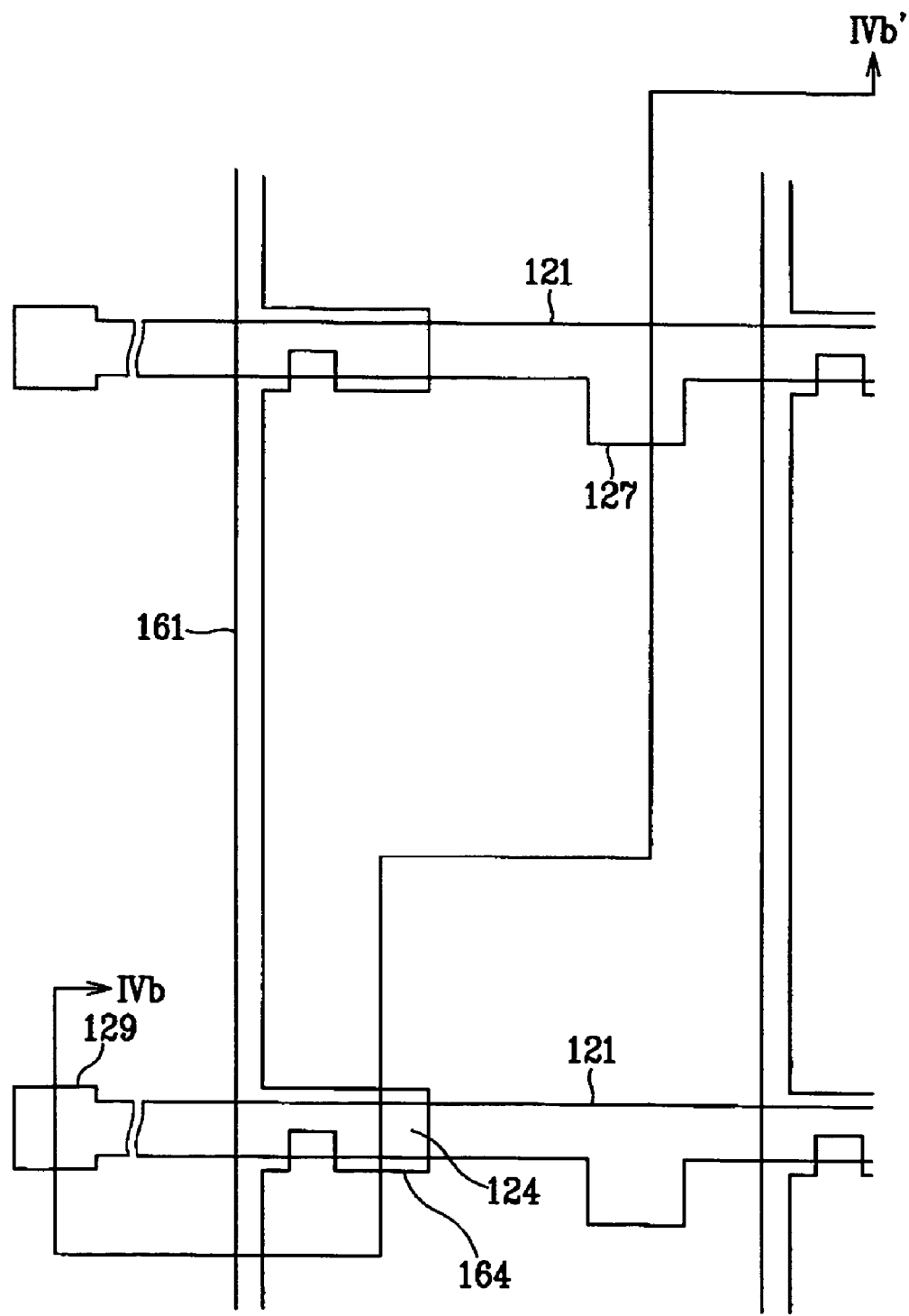
Figure 4B:
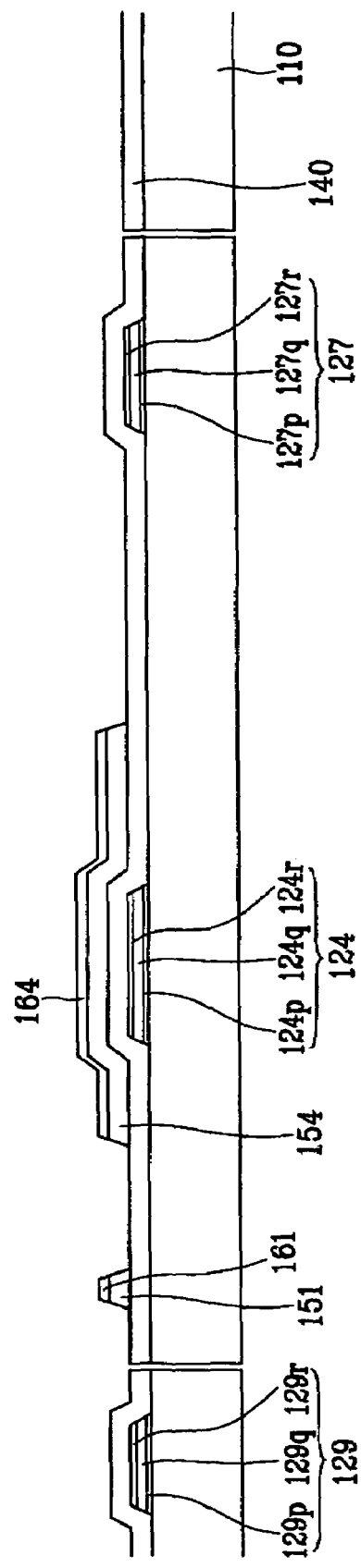
FIG. 4B is a sectional view of the TFT array panel shown in FIG. 4A taken along the line IVb-IVb' in the step following the step shown in FIG. 3B.

Referring to FIGS. 4A and 4B, after sequential deposition of a gate insulating layer 140, an intrinsic a-Si layer, and an extrinsic a-Si layer, the extrinsic a-Si layer and the intrinsic a-Si layer are photo-etched to form a plurality of extrinsic semiconductor stripes 161 and a plurality of intrinsic semiconductor stripes 151 respectively having projections 164 and 154. The gate insulating layer 140 preferably comprises silicon nitride having a thickness of about 2,000 Å to about 5,000 Å, and the deposition temperature is preferably in a range between about 250° C. and about 500° C.

Since this process is performed at a high temperature of over 200° C., the amorphous ITO of the gate line 121 is crystallized.

Next, a first layer of a conductive oxide, such as ITO, a second layer of a Cu-containing metal, and a third layer of a conductive oxide, such as ITO, are sequentially deposited on the extrinsic semiconductor stripes 161.

The first layer and the third layer of a conductive oxide prevent the Cu of the second layer from diffusing into the semiconductor layer 151 and a pixel electrode 190 which will be formed thereon.

The first layer and the third layer may comprise ITO or IZO. When the first layer and the third layer are formed of ITO, the sputtering is performed at a temperature between 25° C. and 150° C. while supplying hydrogen gas ($H_2$) or water vapor ($H_2O$). This operating condition results in the formation of an amorphous ITO layer.

Since the amorphous ITO or IZO can be etched along with the Cu layer by a weak acid, the layers can be simultaneously patterned.

When nitrogen gas ($N_2$), nitrous oxide ($N_2O$), or ammonia ($NH_3$) is supplied during sputtering of the ITO or IZO target, an ITON or IZON layer is formed for preventing oxidation of the Cu layer at the interface.

The first and third layers are formed to have a thickness of about 50 Å to 500 Å and the second layer is formed to have a thickness of about 1,500 Å to 3,000 Å.

Then, a photoresist is coated on the third layer and is illuminated with a light through a photo-mask. Next, the illuminated photoresist is developed.

The first to third layers are simultaneously etched to form a plurality of data lines 171 using an etchant, such as, e.g., hydrogen peroxide ($H_2O_2$) or a common etchant containing an appropriate amount of phosphoric acid ($H_2PO_3$), nitric acid ($HNO_3$), and acetic acid ($CH_3COOH$).

Figure 5A:
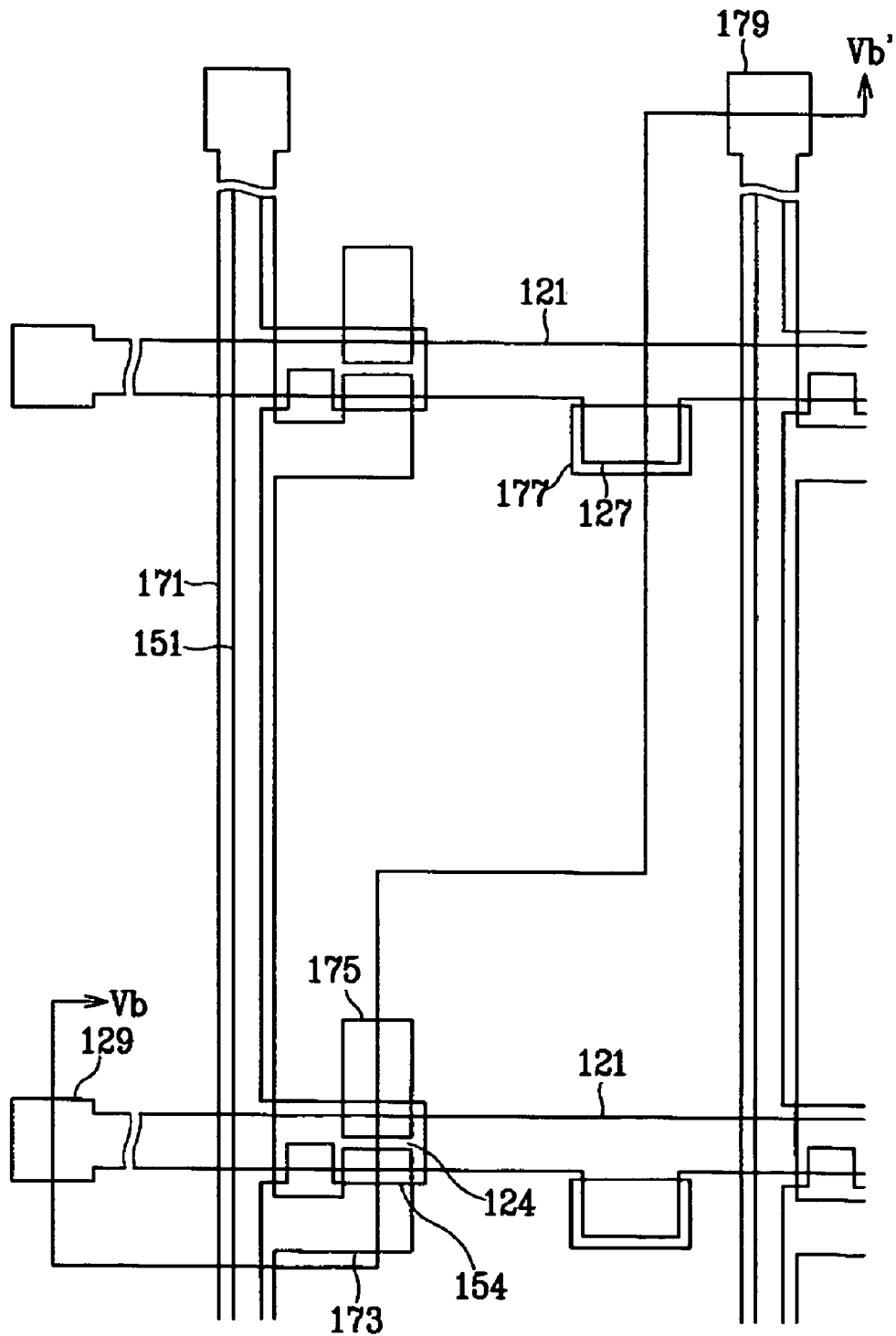
Figure 5B:
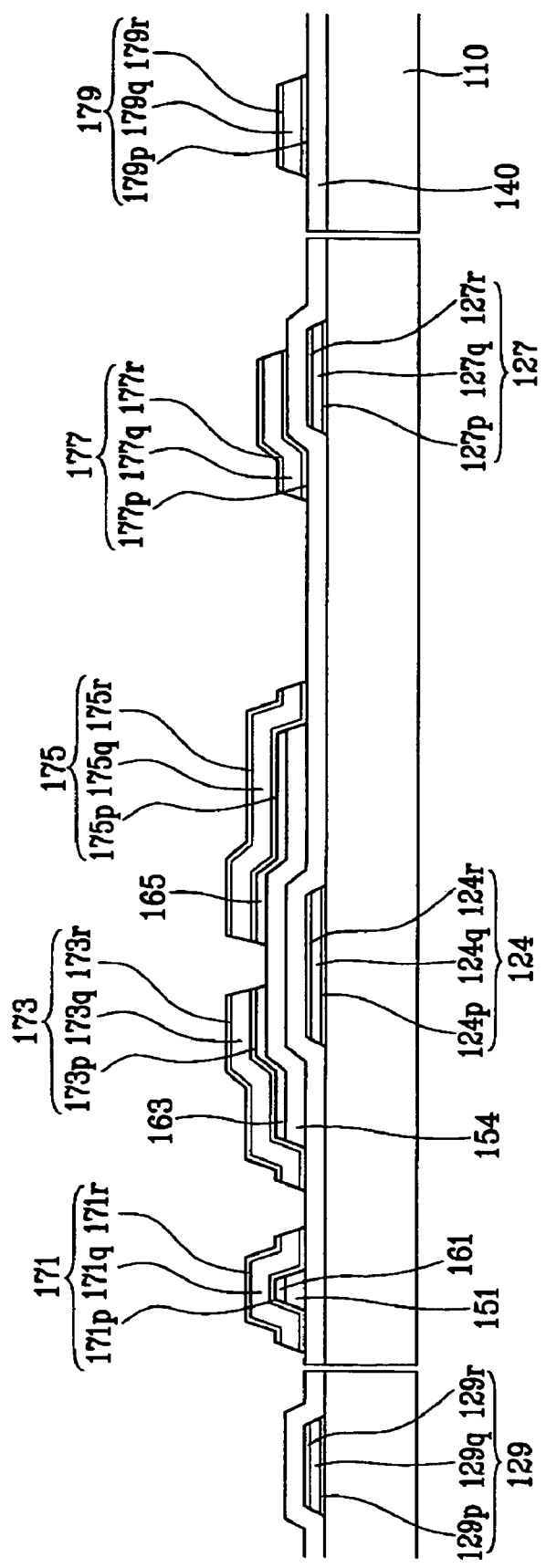
FIG. 5B is a sectional view of the TFT array panel shown in FIG. 5A taken along the line Vb-Vb' in the step following the step shown in FIG. 4B.

Through the above-described processes, as shown in FIGS. 5A and 5B, a plurality of data lines 171 having a plurality of source electrodes 173, a plurality of drain electrodes 175, an end portion 179, and storage capacitor conductors 177 are formed.

Next, portions of the extrinsic semiconductor stripes 161, which are not covered with the data lines 171 and the drain electrodes 175, are removed by etching to form a plurality of ohmic contacts 163 and 165 and to expose portions of the intrinsic semiconductor stripes 151. Oxygen plasma treatment may follow thereafter in order to stabilize the exposed surfaces of the semiconductor stripes 151.

Figure 6A:
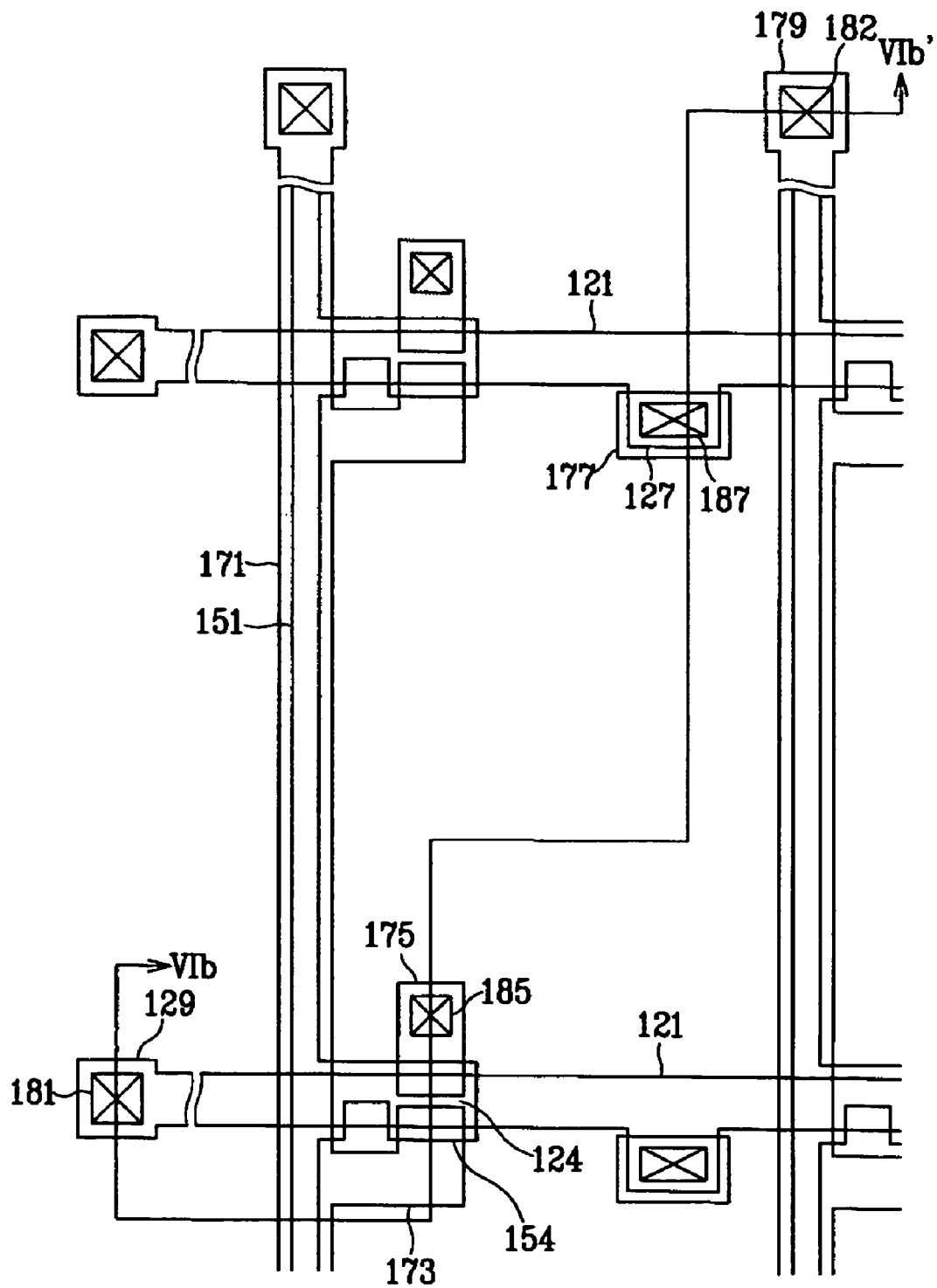
Figure 6B:
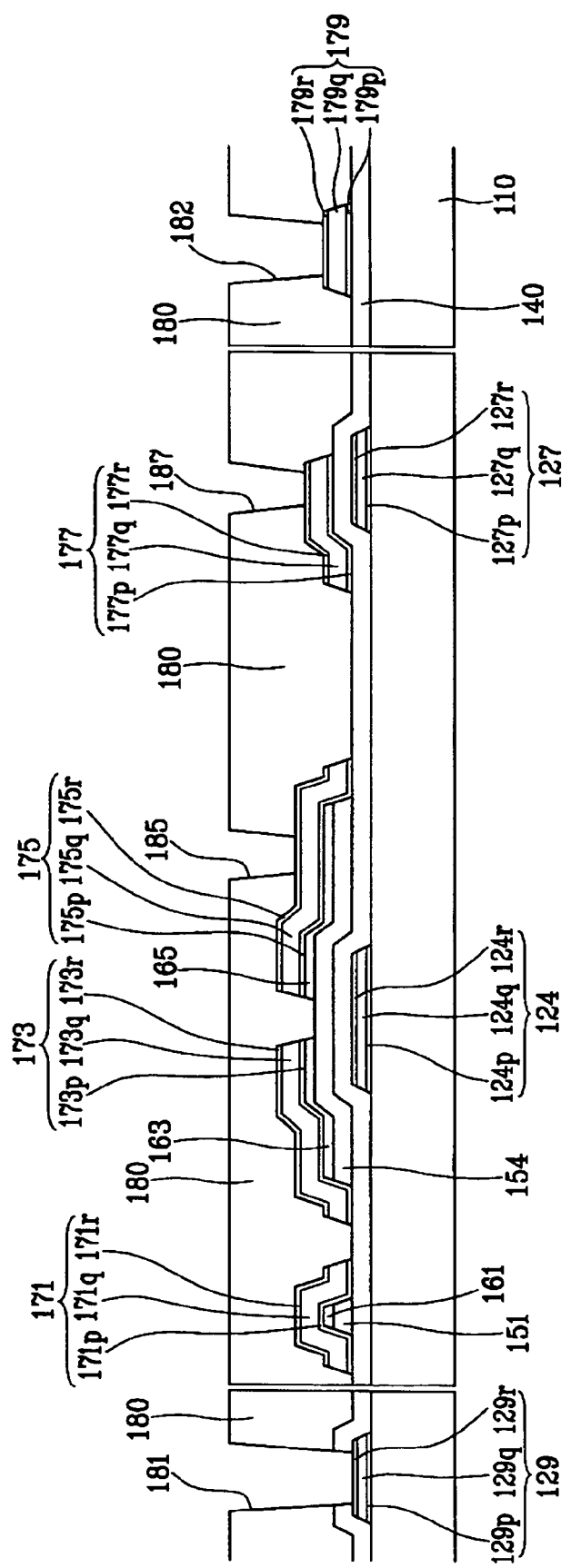
FIG. 6B is a sectional view of the TFT array panel shown in FIG. 6A taken along the line VIb-VIb' in the step following the step shown in FIG. 5B.

Referring to FIGS. 6A and 6B, a passivation layer 180 is deposited and dry etched along with the gate insulating layer 140 to form a plurality of contact holes 181, 185, 187, and 182. The gate insulating layer 140 and the passivation layer 180 are preferably etched under an etch condition having substantially the same etch ratio for both the gate insulating layer 140 and the passivation layer 180.

When the passivation layer comprises a photosensitive material, the contact holes can be formed using only photolithography, without a subsequent etching step.

Next, an indium tin oxide (ITO) layer is deposited on the passivation layer 180 to a thickness of about 400 Å to 1500 Å and is patterned to form a plurality of pixel electrodes 190 and contact assistants 81 and 82.

In the present embodiment, ITO is the primary conductive oxide, but another conductive oxide such as IZO may also be applied as a conductive oxide of the present invention.

In the present embodiment, conductive oxide layers are disposed on lower and upper sides of a Cu layer. However, one of the upper and lower conductive oxide layers may be omitted.

Embodiment 2

Now, a TFT panel for an active matrix organic light emitting display (AM-OLED) according to another embodiment of the present invention will be described.

Figure 7:
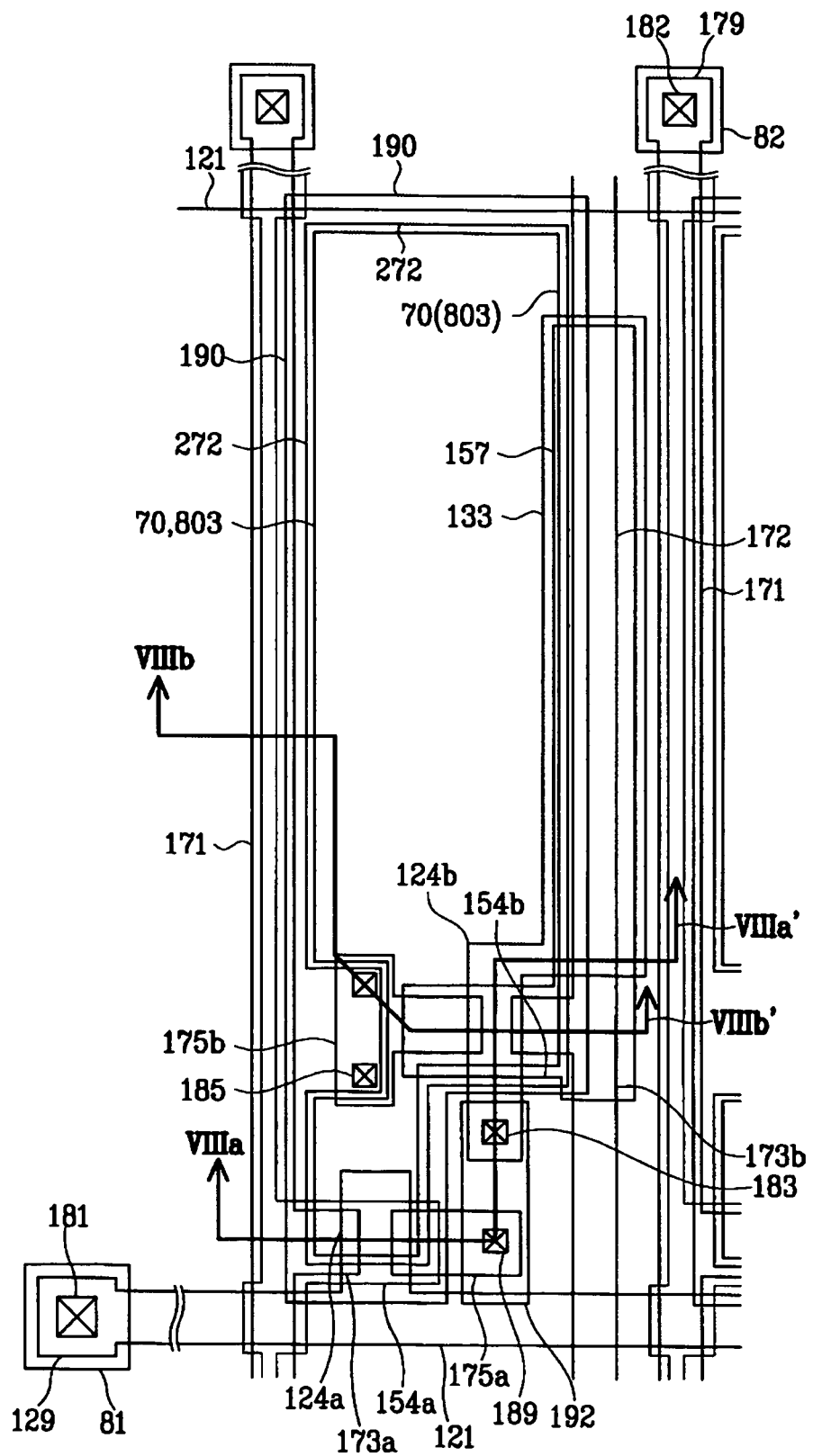
FIG. 7 is a layout view of a TFT array panel for an OLED according to another embodiment of the present invention.
Figure 8A:
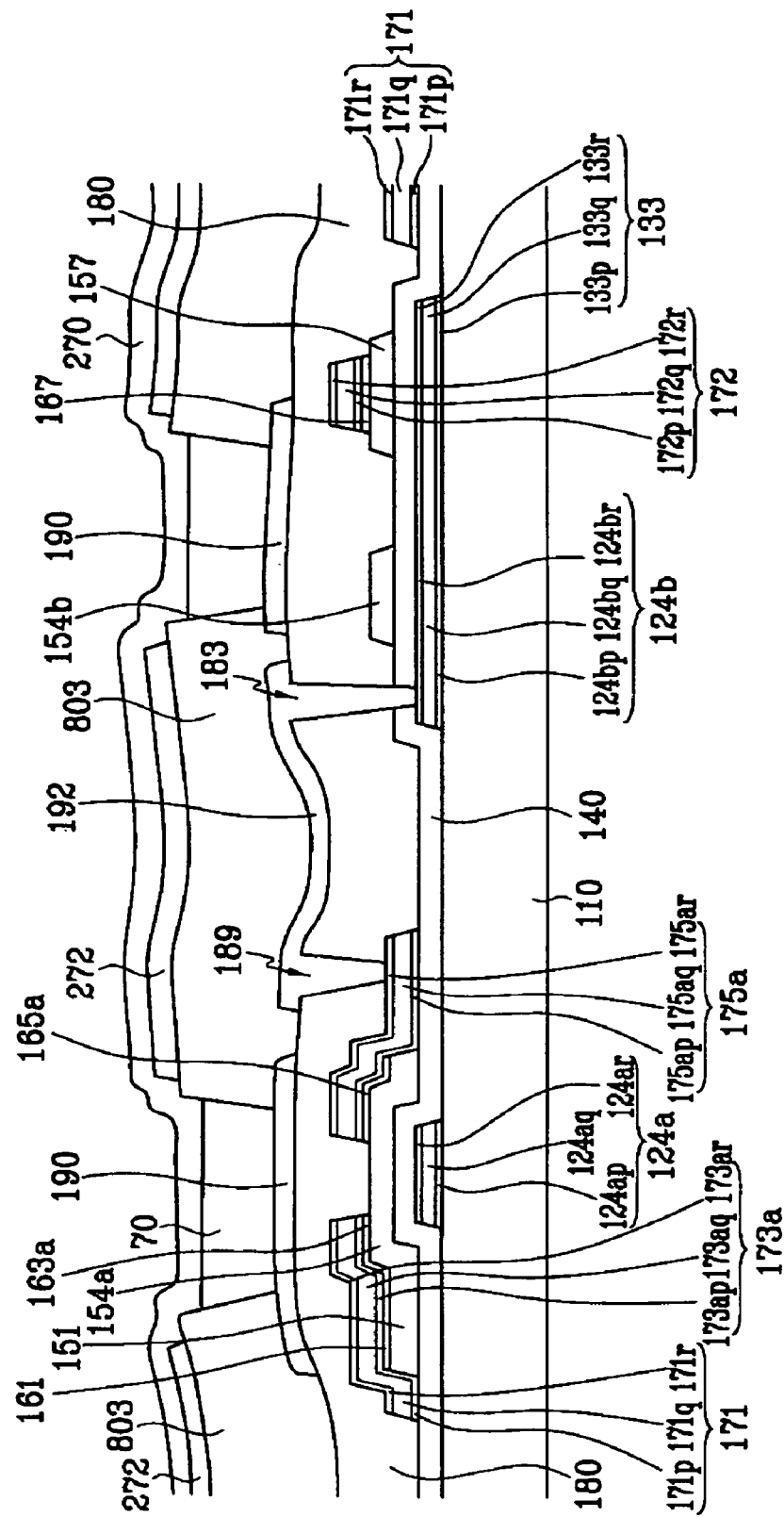
FIGS. 8A and 8B are sectional views of the TFT array panel shown in FIG. 7 taken along the line VIIIa-VIIIa' and the line VIIIb-VIIIb', respectively.
Figure 8B:
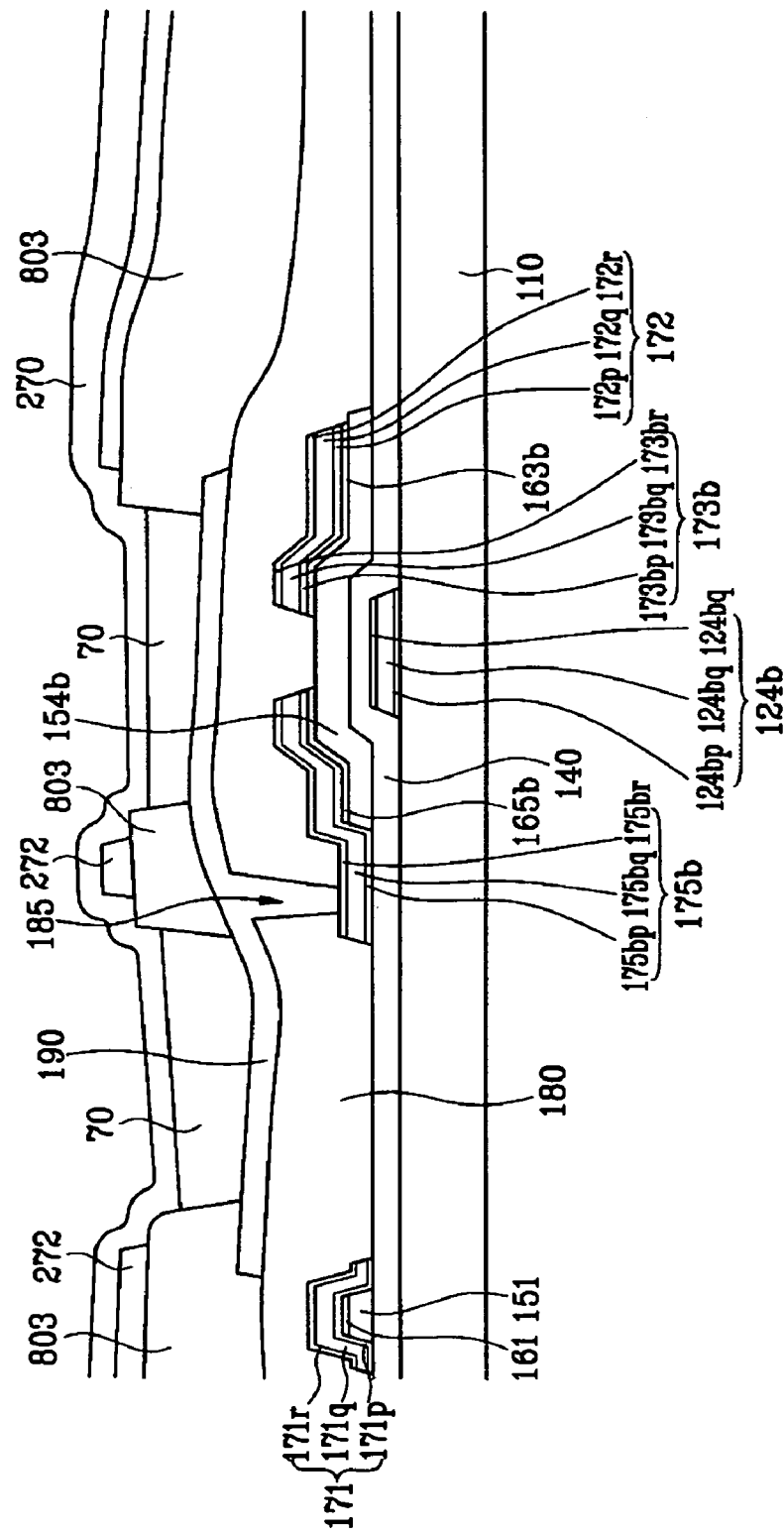

FIG. 7 is a layout view of a TFT array panel for an OLED according to another embodiment of the present invention. FIGS. 8A and 8B are sectional views of the TFT array panel shown in FIG. 7 taken along the line VIIIa-VIIIa' and the line VIIb-VIIb', respectively.

A plurality of gate conductors that include a plurality of gate lines 121, including a plurality of first gate electrodes 124a and a plurality of second gate electrodes 124b, are formed on an insulating substrate 110 such as transparent glass.

The gate lines 121 transmitting gate signals extend substantially in a transverse direction and are separated from each other. The first gate electrodes 124a protrude upward, as viewed from the perspective shown in FIG. 7. The gate lines 121 may extend to be connected to a driving circuit (not shown) integrated on the substrate 110. Alternatively, the gate lines 121 may have an end portion (not shown) having a large area for connection with another layer or an external driving circuit mounted on the substrate 110 or on another device such as a flexible printed circuit film (not shown) that may be attached to the substrate 110.

Each of the second gate electrodes 124b is separated from the gate lines 121 and includes a storage electrode 133 extending substantially in a transverse direction between two adjacent gate lines 121.

The gate lines 121, the first and second gate electrodes 124a and 124b, and the storage electrodes 133 have first layers 124ap, 124bp, and 133p and second layers 124aq, 124bq, and 133q formed on the first layers 124ap, 124bp, and 133p, and third layers 124ar, 124br, 133r formed on the second layers 124aq, 124bq, and 133q. The first layers 124ap, 124bp, and 133p comprise a conductive oxide such as ITO or IZO. The second layers 124aq, 124bq, and 133q comprise a Cu-containing metal such as Cu or a Cu alloy. The third layers 124ar, 124br, 133r comprise a conductive oxide such as ITO or IZO.

Here, the third layers 124ar, 124br, 133r prevent the Cu of the second layers 124aq, 124bq, and 133q from diffusing into a gate insulating layer 140 formed thereon.

When a conductive oxide layer is disposed between a Cu layer and a substrate, adhesiveness between the Cu layer and the substrate is enhanced to prevent the Cu layer from peeling and lifting.

When the conductive oxide layer comprises amorphous ITO, adhesiveness between the Cu layer and the substrate is significantly enhanced. This is because the amorphous ITO layer formed at a low temperature undergoes a high temperature of about 200° C. during the formation of the gate insulating layer 140 and a semiconductor layer 151, thereby resulting in the crystallization of the ITO layer.

A Cu layer and a conductive oxide layer such as an ITO layer or an IZO layer can be etched by the same etching process. Since Cu is strongly affected by acid, it is etched very rapidly when exposed thereto. Accordingly, a weak acid is generally used to etch a Cu layer. However, since other metals such as Mo, Cr, and Ti are etched much more slowly than Cu, when such metals are applied as an underlayer of the Cu layer, two different etching conditions are applied to pattern those layers. In contrast, since the amorphous ITO or IZO is etched along with the Cu layer by the same etching process, they are simultaneously patterned to form the gate line 121.

The first layers 124ap, 124bp, and 133p and the third layers 124ar, 124br, and 133r may comprise an ITON layer or IZON layer to prevent oxidation of Cu at the interfaces of the second layers 124aq, 124bq, and 133q, the first layers 124ap, 124bp, and 133p, and the third layers 124ar, 124br, and 133r. The ITON layer or IZON layer is formed by exposing the ITO layer or IZO layer to a nitrogen atmosphere, and helps to prevent a rapid increase of resistance due to Cu oxidation.

In addition, the lateral sides of the gate conductors 121 and 124b are inclined relative to a surface of the substrate 110, and the inclination angle thereof ranges from about 30 to 80 degrees. A gate insulating layer 140, preferably comprising silicon nitride ($SiN_x$), is formed on the gate conductors 121 and 124b.

A plurality of semiconductor stripes 151 and islands 154b, preferably comprising hydrogenated amorphous silicon (abbreviated to "a-Si") or polysilicon, are formed on the gate insulating layer 140. Each semiconductor stripe 151 extends substantially in the longitudinal direction and has a plurality of projections 154a branching out toward the first gate electrodes 124a. Each semiconductor island 154b crosses a second gate electrode 124b and includes a portion 157 overlapping the storage electrode 133 of the second gate electrode 124b.

A plurality of ohmic contact stripes 161 and ohmic contact islands 163b, 165a, and 165b, which preferably comprise silicide or n+hydrogenated a-Si heavily doped with an n-type impurity such as phosphorous, are formed on the semiconductor stripes 151 and islands 154b. Each ohmic contact stripe 161 has a plurality of projections 163a, and the projections 163a and the ohmic contact islands 165a are located in pairs on the projections 154a of the semiconductor stripes 151. The ohmic contact islands 163b and 165b are located in pairs on the semiconductor islands 154b.

The lateral sides of the semiconductor stripes 151 and islands 154b and the ohmic contacts 161, 163b, 165b, and 165b are inclined relative to a surface of the substrate, and the inclination angles thereof are preferably in a range between about 30-80 degrees.

A plurality of data conductors including a plurality of data lines 171, a plurality of voltage transmission lines 172, and a plurality of first and second drain electrodes 175a and 175b are formed on the ohmic contacts 161, 163b, 165b, and 165b and the gate insulating layer 140.

The data lines 171 for transmitting data signals extend substantially in the longitudinal direction and intersect the gate lines 121. Each data line 171 includes a plurality of first source electrodes 173a, an end portion having a large area for contact with another layer or an external device. The data lines 171 may be directly connected to a data driving circuit for generating the gate signals, which may be integrated on the substrate 110.

The voltage transmission lines 172 for transmitting driving voltages extend substantially in the longitudinal direction and intersect the gate lines 121. Each voltage transmission line 172 includes a plurality of second source electrodes 173b. The voltage transmission lines 172 may be connected to each other. The voltage transmission lines 172 overlap the storage region 157 of the semiconductor islands 154b.

The first and the second drain electrodes 175a and 175b are separated from the data lines 171 and the voltage transmission lines 172, and from each other. Each pair of the first source electrodes 173a and the first drain electrodes 175a are disposed opposite each other with respect to a first gate electrode 124a, and each pair of the second source electrodes 173b and the second drain electrodes 175b are disposed opposite each other with respect to a second gate electrode 124b.

A first gate electrode 124a, a first source electrode 173a, first drain electrode 175a, and a projection 154a of a semiconductor stripe 151 form a switching TFT having a channel formed in the projection 154a disposed between the first source electrode 173a and the first drain electrode 175a. Meanwhile, a second gate electrode 124b, a second source electrode 173b, a second drain electrode 175b, and a semiconductor island 154b form a driving TFT having a channel formed in the semiconductor island 154b disposed between the second source electrode 173b and the second drain electrode 175b.

The data conductors 171, 172, 175a, and 175b preferably have first layers 171p, 172p, 175ap, and 175bp, second layers 171q, 172q, 175aq, and 175bq, and third layers 171r, 172r, 175ar, and 175br. The second layers 171q, 172q, 175ap, and 175bp comprise a Cu-containing metal such as Cu or a Cu alloy. The first layers 171p, 172p, 175ap, and 175bp and third layers 171r, 172r, 175ar, and 175br are respectively disposed at lower and upper sides of the second layers 171q, 172q, 175aq, and 175bq. The first layers 171p, 172p, 175ap, and 175bp and the third layers 171r, 172r, 175ar, and 175br comprise a conductive oxide.

The first layers 171p, 172p, 175ap, and 175bp and the third layers 171r, 172r, 175ar, and 175br may comprise ITO or IZO. Here, the first layers 171p, 172p, 175ap, and 175bp and the third layers 171r, 172r, 175ar, and 175br comprise a conductive oxide to prevent the Cu of the second layers 171q, 172q, 175aq, and 175bq from diffusing into the semiconductor layer 151 and a pixel electrode 190 formed thereon. When the conductive oxide layer comprises ITO, amorphous ITO is preferable. Since the amorphous ITO or IZO is etched along with Cu by the same etching process, the layers are simultaneously patterned to form the data lines 171 having a smooth profile.

The first layers 171p, 172p, 175ap, and 175bp and the third layers 171r, 172r, 175ar, and 175br preferably comprise an ITON layer or IZON layer to prevent oxidation of Cu at the interface of the second layers 171q, 172q, 175aq, and 175bq and the first and third layers 171p, 172p, 175ap, 175bp, 171r, 172r, 175ar, and 175br. The ITON layer or IZON layer is formed by exposing the ITO layer or IZO layer to a nitrogen atmosphere, and it prevents a rapid increase of resistance due to Cu oxidation.

Like the gate conductors 121 and 124b, the data conductors 171, 172, 175a, and 175b have tapered lateral sides relative to the surface of the substrate 110, and the inclination angles thereof range from about 30 to 80 degrees.

The ohmic contacts 161, 163b, 165b, and 165b are interposed only between the underlying semiconductor stripes 151 and islands 154b and the overlying data conductors 171, 172, 175a, and 175b thereon, and reduce the contact resistance therebetween. The semiconductor stripes 151 include a plurality of exposed portions that are not covered with the data conductors 171, 172, 175a, and 175b.

Most of the semiconductor stripe 151 is narrower than the data line 171, but the width of the semiconductor stripe 151 broadens near a location where the semiconductor stripe 151 and the gate line 121 meet each other in order to prevent disconnection of the data line 171, as mentioned above.

A passivation layer 180 is formed on the data conductors 171, 172, 175a, and 175b and the exposed portions of the semiconductor stripes 151 and islands 154b. The passivation layer 180 preferably comprises an inorganic material, such as silicon nitride or silicon oxide, a photosensitive organic material having good flatness characteristics, or a low dielectric insulating material having a dielectric constant lower than 4.0, such as a-Si:C:O and a-Si:O:F, formed by plasma enhanced chemical vapor deposition (PECVD). The passivation layer 180 may include a lower film of an inorganic insulator and an upper film of an organic insulator.

The passivation layer 180 has a plurality of contact holes 189, 183, 185, 181, and 182 exposing portions of the first drain electrode 175a, a second gate electrode 124b, the second drain electrode 175b, and the end portions 129 and 179 of the gate line 121 and the data line 171, respectively.

The contact holes 181 and 182 expose the end portions 129 and 179 of the gate line 121 and the data line 171 to provide a connection between the gate line 121 and the data line 171 and external driving circuits. Anisotropic conductive films are disposed between the output terminals of the external driving circuit and the end portions 129 and 175 to assist the electrical connection and physical adhesion. However, when driving circuits are directly fabricated on the substrate 110, contact holes are not formed. In embodiments where the gate driving circuits are directly fabricated on the substrate 110, while the data driving circuits are formed as separate chips, only the contact hole 181 exposing the end portion 179 of the data line 171 is formed.

A plurality of pixel electrodes 190, a plurality of connecting members 192, and a plurality of contact assistants 81 and 82 are formed on the passivation layer 180.

The pixel electrodes 190 are connected to the second drain electrodes 175b through the contact holes 185. The connecting member 192 connects the first drain electrode 175a and the second gate electrode 124b through the contact holes 189 and 183. The contact assistants 81 and 82 are connected to the end portions 81 and 82 of the gate line 121 and the data line 171 through the contact holes 181 and 182, respectively.

The pixel electrode 190, the connecting member 192, and the contact assistants 81 and 82 comprise a transparent conductor such as ITO or IZO.

A partition 803, an auxiliary electrode 272, a plurality of light emitting members 70, and a common electrode 270 are formed on the passivation layer 180, and on the pixel electrodes 190.

The partition 803 comprises an organic or inorganic insulating material and forms frames of organic light emitting cells. The partition 803 is formed along boundaries of the pixel electrodes 190 and defines a space for filling with an organic light emitting material.

The light emitting member 70 is disposed on the pixel electrode 190 and surrounded by the partition 803. The light emitting member 70 comprises one light-emitting material that emits red, green, or blue light. Red, green, and blue light emitting members 70 are sequentially and repeatedly disposed.

The auxiliary electrode 272 has substantially the same planar pattern as the partition 803. The auxiliary electrode 272 contacts the common electrode 270 to reduce resistance of the common electrode 270.

The common electrode 270 is formed on the partition 803, the auxiliary electrode 272, and the light emitting member 70. The common electrode 270 comprises a metal such as Al, which has low resistivity. This embodiment illustrates a back-emitting OLED. However, in embodiments incorporating a front-emitting OLED or a dual-sides-emitting OLED, the common electrode 270 comprises a transparent conductor such as ITO or IZO.

A method of manufacturing the TFT array panel shown in FIGS. 7 to 8B according to an embodiment of the present invention will now be described in detail with reference to FIGS. 9A to 22B as well as FIGS. 7 to 8B.

Figure 20A:
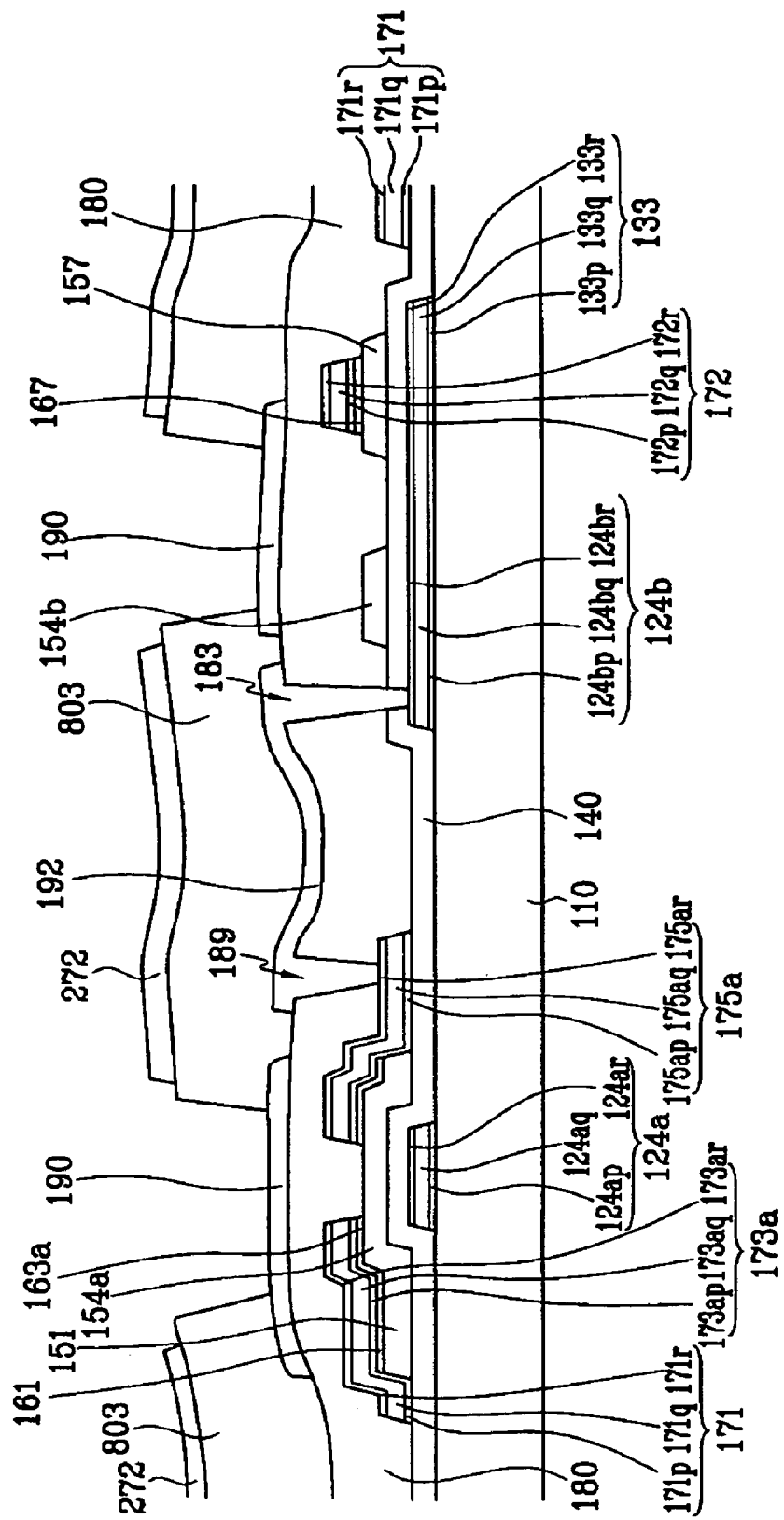
FIGS. 20A and 20B are sectional views of the TFT array panel shown in FIG. 19 taken along the lines XXa-XXa' and XXb-XXb'.
Figure 20B:
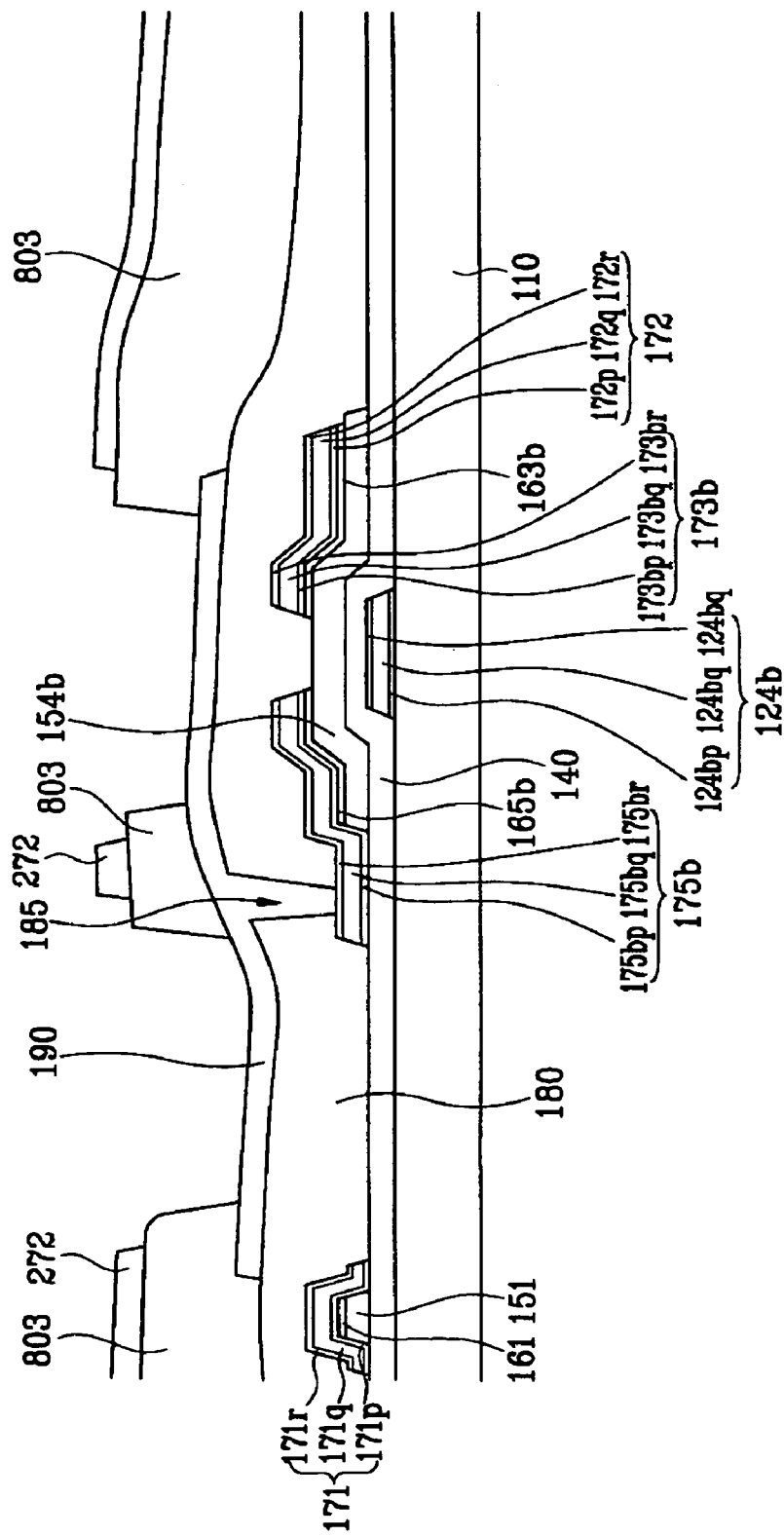
Figure 21:
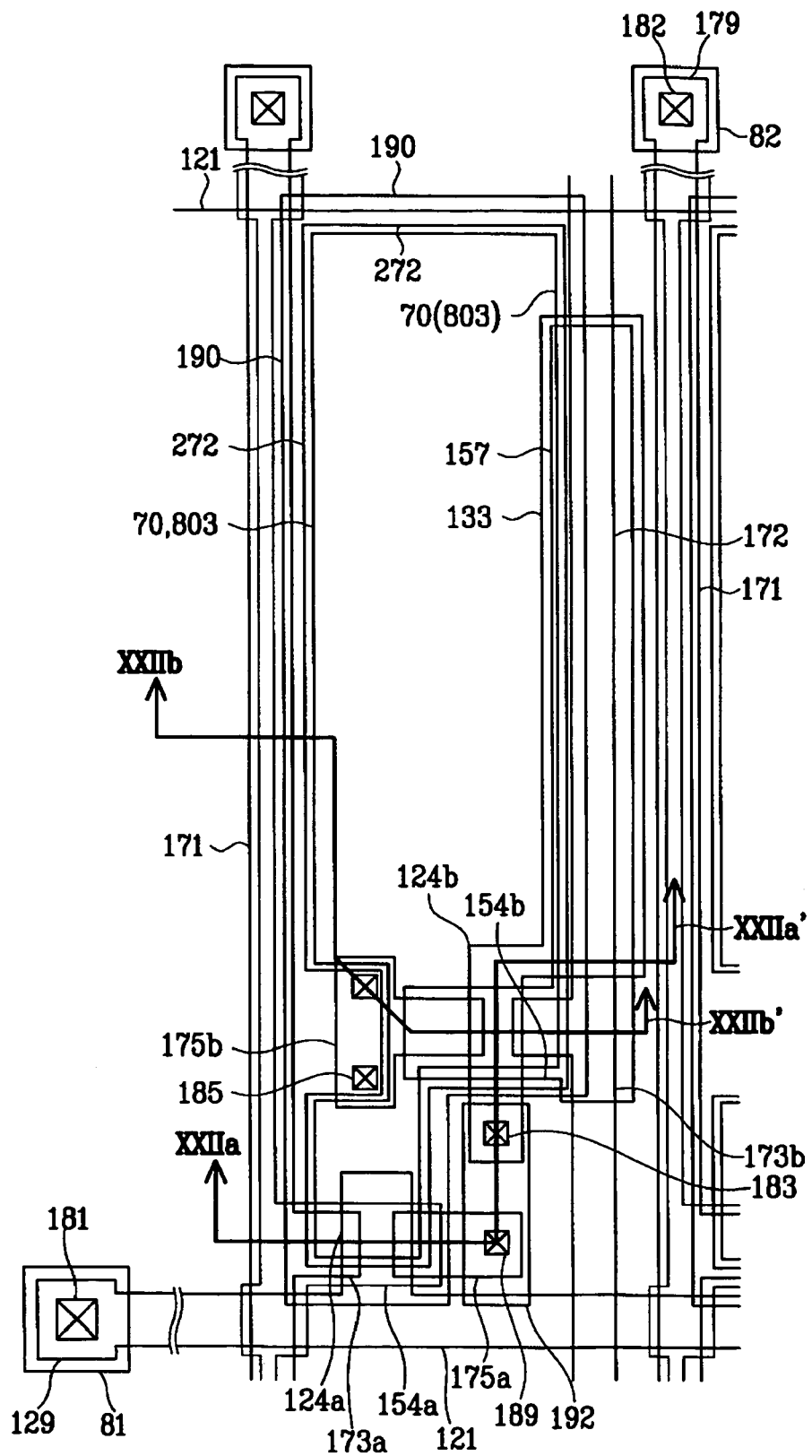
Figure 22A:
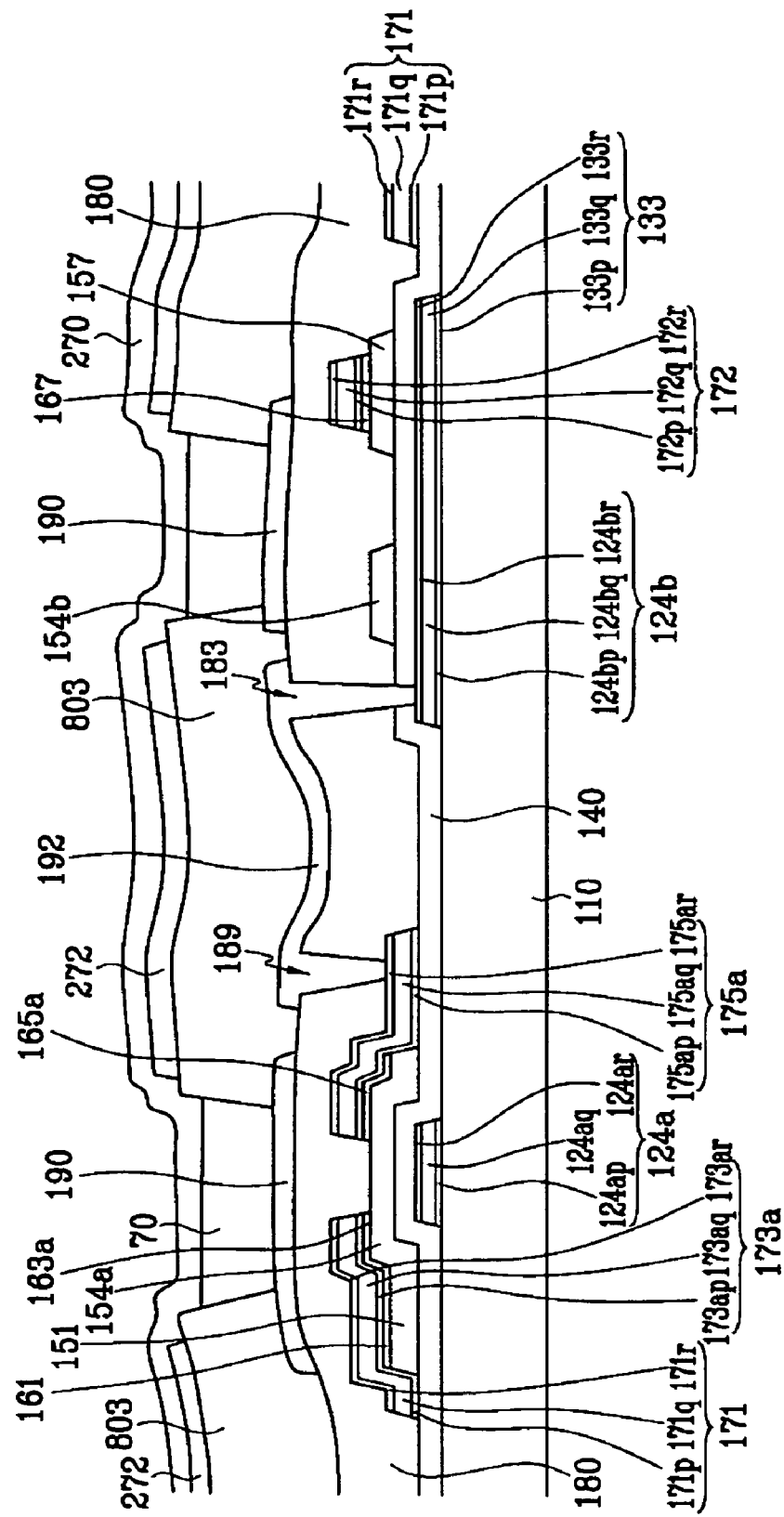
FIGS. 22A and 22B are sectional views of the TFT array panel shown in FIG. 21 taken along the lines XXIIa-XXIIa' and XXIIb-XXIIb'.
Figure 22B:
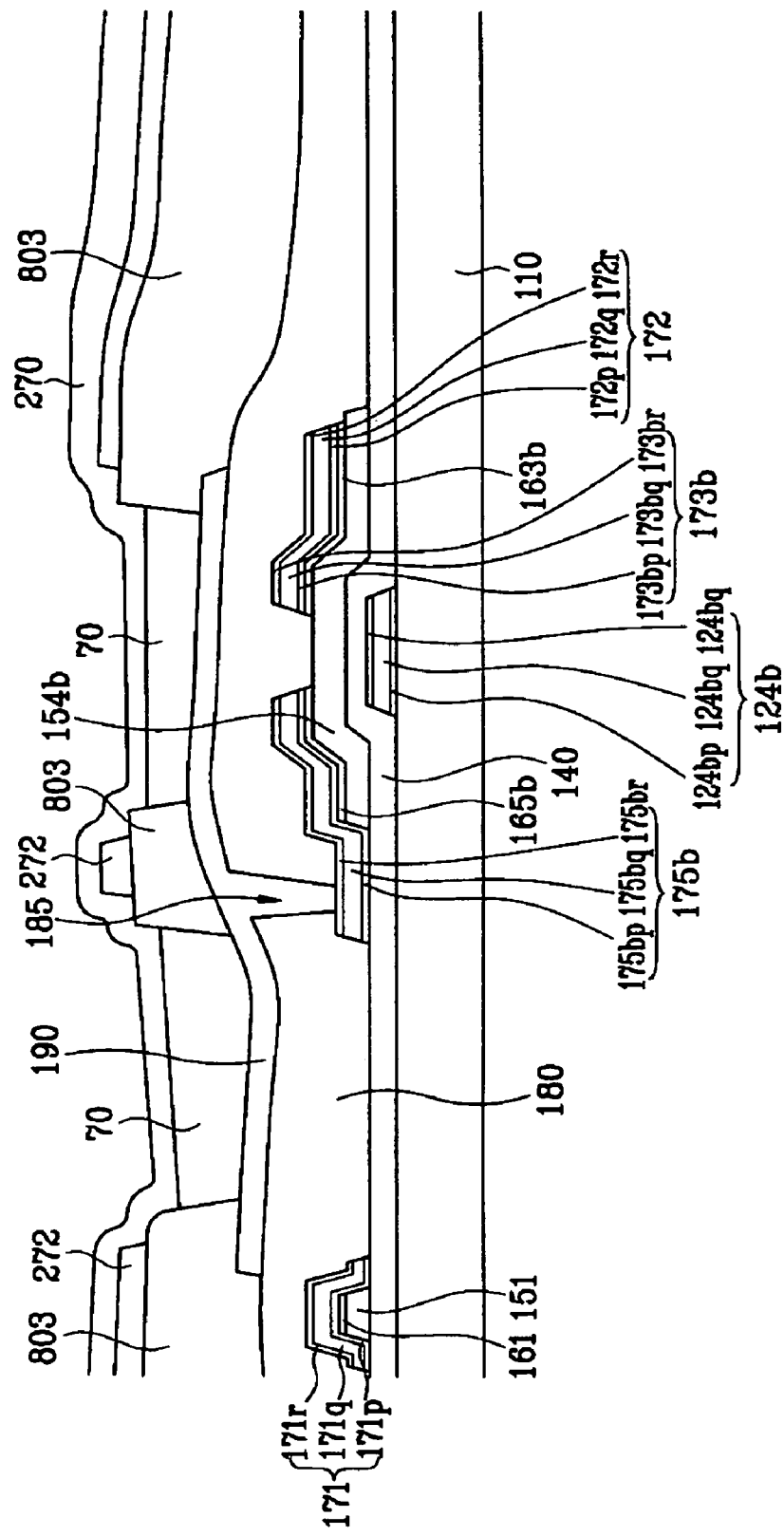

FIGS. 9, 11, 13, 15, 17, 19, and 21 are layout views of the TFT array panel shown in FIGS. 7 to 8B in intermediate steps of a manufacturing method according to an embodiment of the present invention. FIGS. 10A and 10B are sectional views of the TFT array panel shown in FIG. 9 taken along the lines Xa-Xa' and Xb-Xb'. FIGS. 12A and 12B are sectional views of the TFT array panel shown in FIG. 11 taken along the lines XIIa-XIIa' and XIIb-XIIb'. FIGS. 14A and 14B are sectional views of the TFT array panel shown in FIG. 13 taken along the lines XIVa-XIVa' and XIVb-XIVb'. FIGS. 16A and 16B are sectional views of the TFT array panel shown in FIG. 15 taken along the lines XVIa-XVIa' and XVIb-XVIb'. FIGS. 18A and 18B are sectional views of the TFT array panel shown in FIG. 17 taken along the lines XVIIIa-XVIIIa' and XVIIIb-XVIIIb'. FIGS. 20A and 20B are sectional views of the TFT array panel shown in FIG. 19 taken along the lines XXa-XXa' and XXb-XXb'. FIGS. 22A and 22B are sectional views of the TFT array panel shown in FIG. 21 taken along the lines XXIIa-XXIIa' and XXIIb-XXIIb'.

Figure 9:
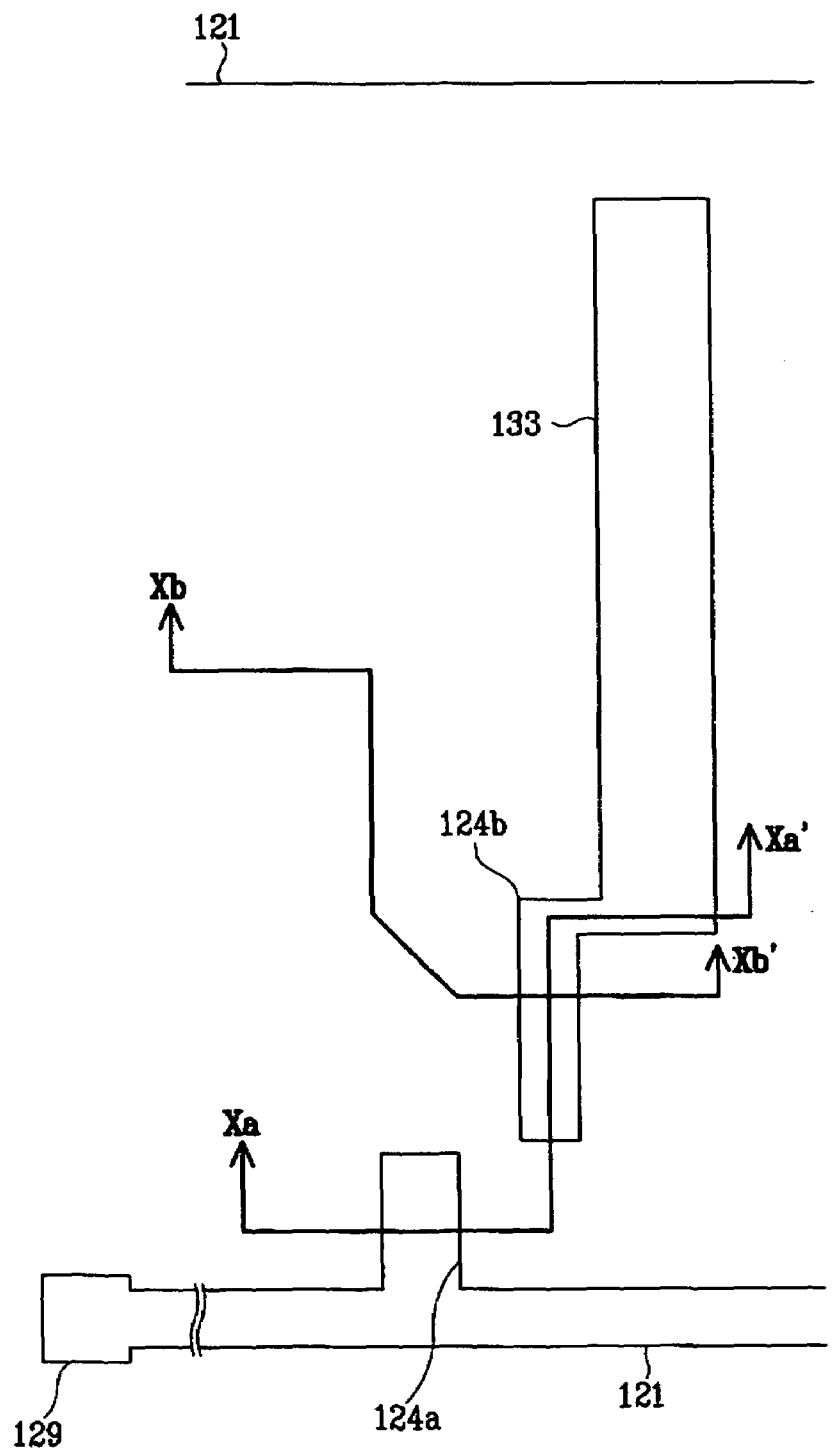
FIGS. 9, 11, 13, 15, 17, 19, and 21 are layout views of the TFT array panel shown in FIGS. 7 to 8B in intermediate steps of a manufacturing method according to an embodiment of the present invention.
Figure 10B:
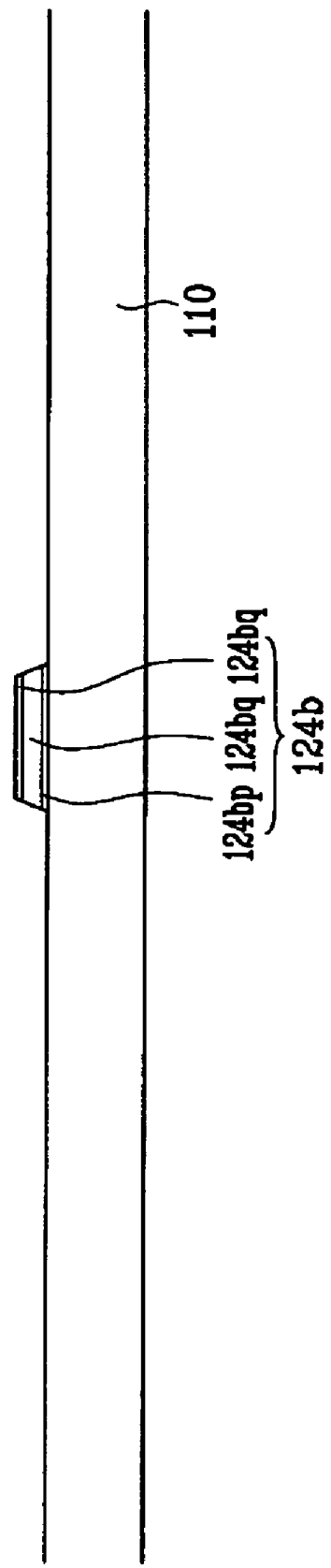

First, as shown in FIGS. 9 and 10B, a first layer of a conductive oxide such as ITO or IZO, a second layer of a Cu-containing metal, and a third layer of a conductive oxide such as ITO or IZO are formed on an insulating substrate 110.

The first layer and the second layer may be deposited by co-sputtering. Two targets are installed in the same sputtering chamber for the co-sputtering. One target comprises a conductive oxide such as ITO or IZO, and the other target comprises a Cu-containing metal such as Cu or a Cu-alloy. Hereinafter, examples of an ITO target and a Cu target will be described.

The co-sputtering is performed as follows.

At first, in order to deposit a first ITO layer, power is applied to the ITO target while no power is applied to the Cu target. The sputtering is performed at a temperature between 25° C. and 150° C. while supplying hydrogen gas ($H_2$) or water vapor ($H_2O$). Such condition result in the formation of an amorphous ITO layer. The ITO layer has a thickness of 50 Å to 500 Å.

Next, a Cu layer is deposited by switching the power to be applied to the Cu target and not to be applied to the ITO target. The Cu layer has a thickness of 50 Å to 2,000 Å.

Next, a second ITO layer is deposited by switching the power to be applied again to the ITO target and not to be applied to the Cu target. The sputtering is performed at a temperature between 25° C. and 150° C. while supplying hydrogen gas ($H_2$) or water vapor ($H_2O$). Such conditions result in the formation of an amorphous ITO layer. The second ITO layer has a thickness of 50 Å to 500 Å.

Nitrogen gas ($N_2$), nitrous oxide ($N_2O$), or ammonia ($NH_3$) may be applied during sputtering of the ITO target to form an ITON layer.

When a conductive oxide layer is disposed between a Cu layer and a substrate, adhesiveness between the Cu layer and the substrate is enhanced. The conductive oxide layer applied on top of the Cu layer prevents the Cu from diffusing into a gate insulating layer 140 which will be formed thereon.

When the conductive oxide layer comprises amorphous ITO, adhesiveness between the Cu layer and the substrate 110 is significantly enhanced. This is because the amorphous ITO layer formed at a low temperature undergoes a high temperature of about 200° C. during the formation of the gate insulating layer 140 and a semiconductor layer 151, thereby resulting in the crystallization of the ITO layer.

An amorphous ITO layer or an amorphous IZO layer can be etched by a weak acid. Since Cu is strongly affected by acid, it is etched very fast therewith. Accordingly, a weak acid is generally used to etch a Cu layer. However, since other metals such as Mo, Cr, and Ti are etched much more slowly than Cu, when such metals are applied as an underlayer of the Cu layer, two different etching conditions are applied to pattern those layers. In contrast, since the amorphous ITO or IZO can be etched along with the Cu layer by a weak acid, the layers can be simultaneously patterned to form the gate line 121, the second gate electrode 124b, and the voltage transmission line 172.

As in the above descriptions, when an amorphous ITO or IZO layer is disposed between a Cu layer and a substrate, the adhesiveness between the Cu layer and the substrate etching efficiency is enhanced. The amorphous ITO or IZO layer prevents diffusion of Cu to another layer.

When nitrogen gas ($N_2$), nitrous oxide ($N_2O$), or ammonia ($NH_3$) is supplied during sputtering of the ITO or IZO target, an ITON or IZON layer is formed to prevent oxidation of the Cu layer at the interface.

Then, a photoresist is coated on the second ITO layer and is illuminated with a light through a photo-mask. Next, the illuminated photoresist is developed.

The two ITO layers and the Cu layer are simultaneously etched using an etchant to form a plurality of gate lines 121, the second gate electrode 124b, and the voltage transmission line 172. The etchant may be one of hydrogen peroxide ($H_2O_2$) or a common etchant containing an appropriate amount of phosphoric acid ($H_2PO_3$), nitric acid ($HNO_3$), and acetic acid ($CH_3COOH$).

Figure 11:
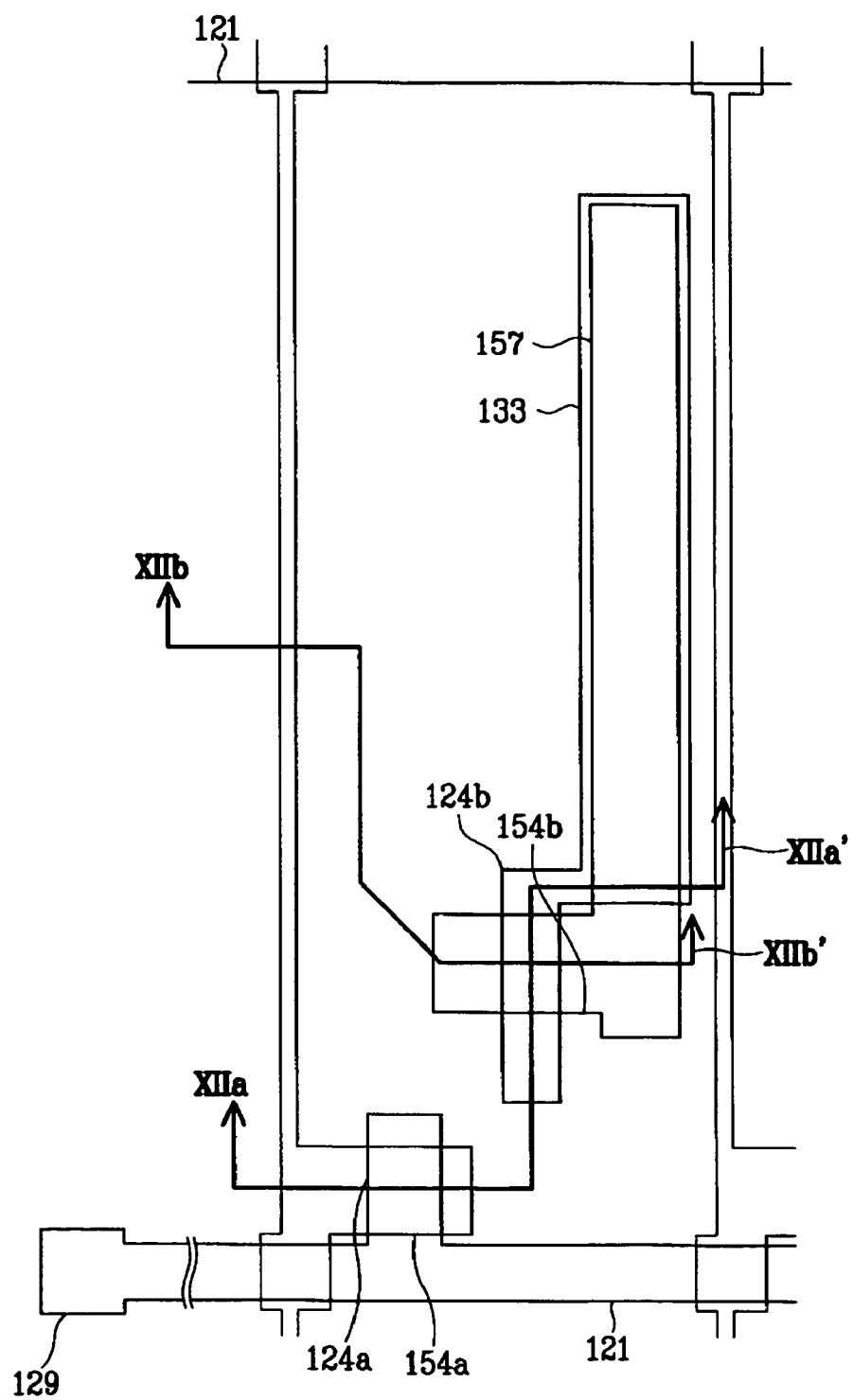
Figure 12A:
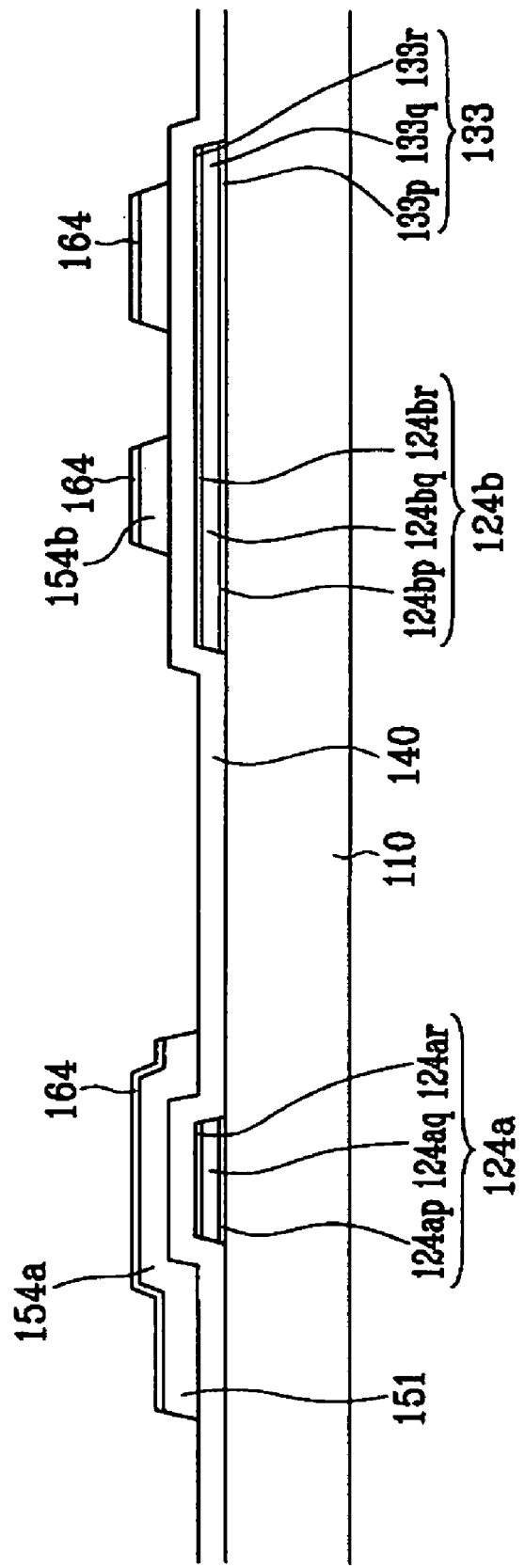

Referring to FIGS. 11-12B, after sequential deposition of a gate insulating layer 140, an intrinsic a-Si layer, and an extrinsic a-Si layer, the extrinsic a-Si layer and the intrinsic a-Si layer are photo-etched to form a plurality of extrinsic semiconductor stripes 164 and a plurality of intrinsic semiconductor stripes 151 and islands 154b including projections 154a on the gate insulating layer 140. The gate insulating layer 140 preferably comprises silicon nitride having a thickness of about 2,000 Å to about 5,000 Å, and the deposition temperature is preferably in a range of about 250° C. to about 500° C.

Since this process is performed at a high temperature of over 200° C., the amorphous ITO of the gate line 121 is crystallized.

Figure 13:
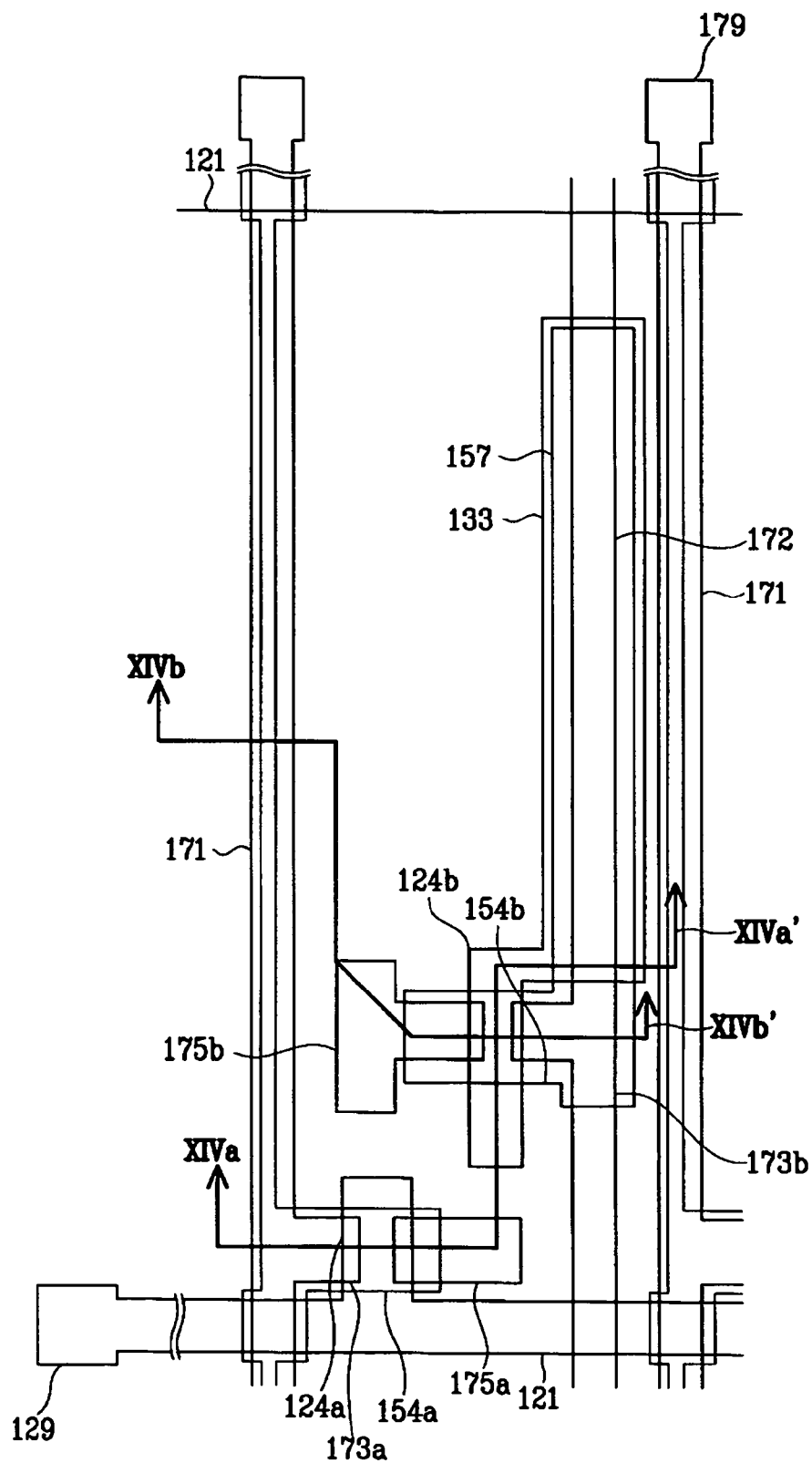
Figure 14A:
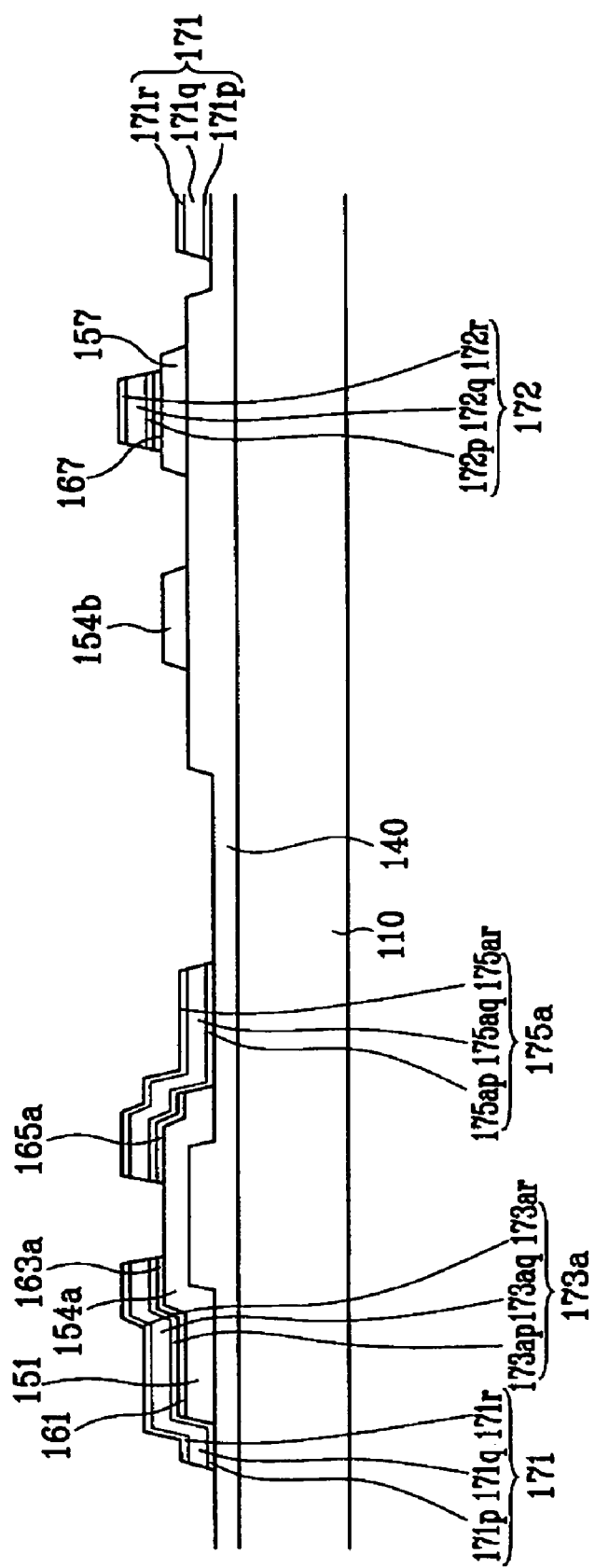
FIGS. 14A and 14B are sectional views of the TFT array panel shown in FIG. 13 taken along the lines XIVa-XIVa' and XIVb-XIVb'.
Figure 14B:
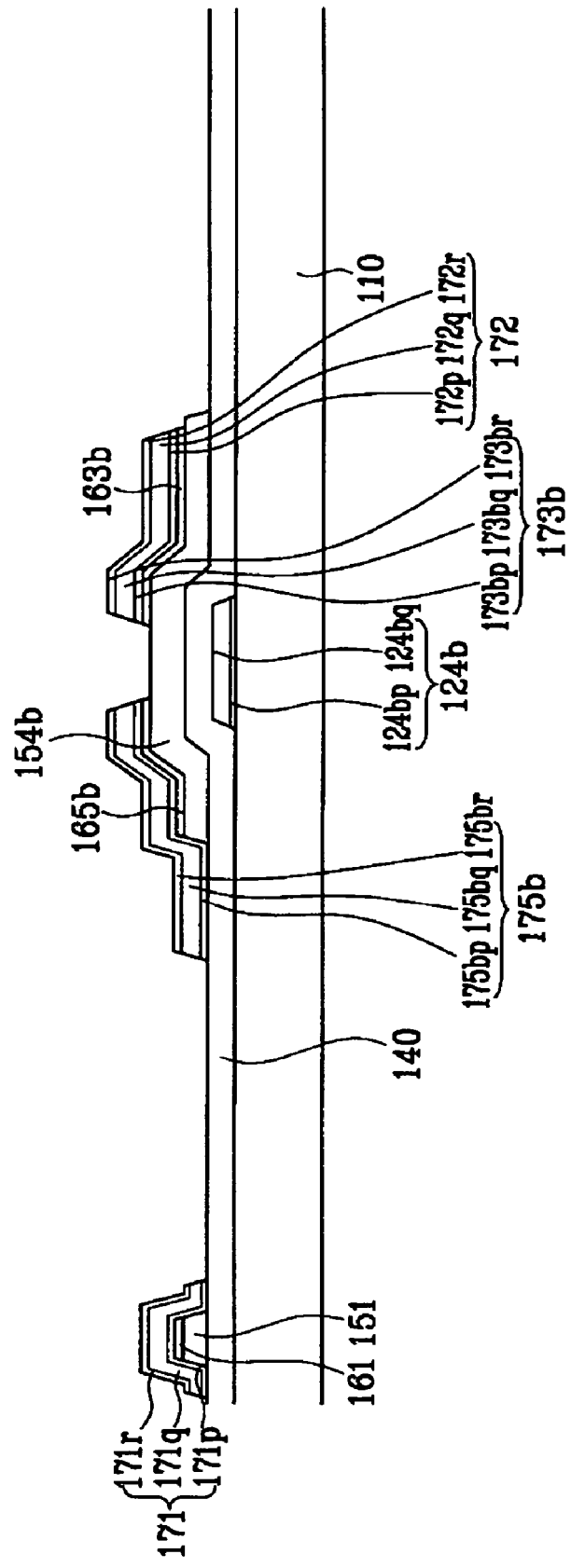

Next, referring to FIGS. 13 to 14B, a first layer of a conductive oxide such as ITO, a second layer of a Cu-containing metal, and a third layer of a conductive oxide such as ITO are sequentially deposited on the extrinsic semiconductor stripes 161.

The first layer and the third layer of a conductive oxide prevent the Cu of the second layer from diffusing into the semiconductor layer 151 and a pixel electrode 190 which will be formed thereon.

The first layer and the third layer may comprise ITO or IZO. When the first layer and the third layer are formed of ITO, the sputtering is performed at a temperature between 25° C. and 150° C. while supplying hydrogen gas ($H_2$) or water vapor ($H_2O$). This operating condition results in the formation of an amorphous ITO layer.

Since the amorphous ITO or IZO can be etched along with the Cu layer by a weak acid, the layers can be simultaneously patterned.

When nitrogen gas ($N_2$), nitrous oxide ($N_2O$), or ammonia ($NH_3$) is supplied during sputtering of the ITO or IZO target, an ITON or IZON layer is formed for preventing oxidation of the Cu layer at the interface.

The first and third layers are formed to have a thickness of about 50 Å to 500 Å, and the second layer is formed to have a thickness of about 1,500 Å to 3,000 Å.

Then, a photoresist is coated on the third layer and is illuminated with a light through a photo-mask. Next, the illuminated photoresist is developed.

The first to third layers are simultaneously etched to form a plurality of data lines 171 using an etchant, such as, e.g., hydrogen peroxide ($H_2O_2$) or a common etchant containing an appropriate amount of phosphoric acid ($H_3PO_3$), nitric acid ($HNO_3$), and acetic acid ($CH_3COOH$).

Through the above-described processes, as shown in FIGS. 13 to 14B, a plurality of data lines 171 having a plurality of first source electrodes 173a, a plurality of first and second drain electrodes 175a and 175b, and a plurality of voltage transmission lines 172 having second source electrodes 173b are formed.

Before or after removing the photoresist, portions of the extrinsic semiconductor stripes 164, which are not covered with the data conductors 171, 172, 175a, and 175b, are removed by etching to form a plurality of ohmic contact stripes 161 including projections 163a and a plurality of ohmic contact islands 163b, 165a, and 165b, and to expose portions of the intrinsic semiconductor stripes 151 and islands 154b.

Oxygen plasma treatment may follow thereafter in order to stabilize the exposed surfaces of the semiconductor stripes 151.

Figure 15:
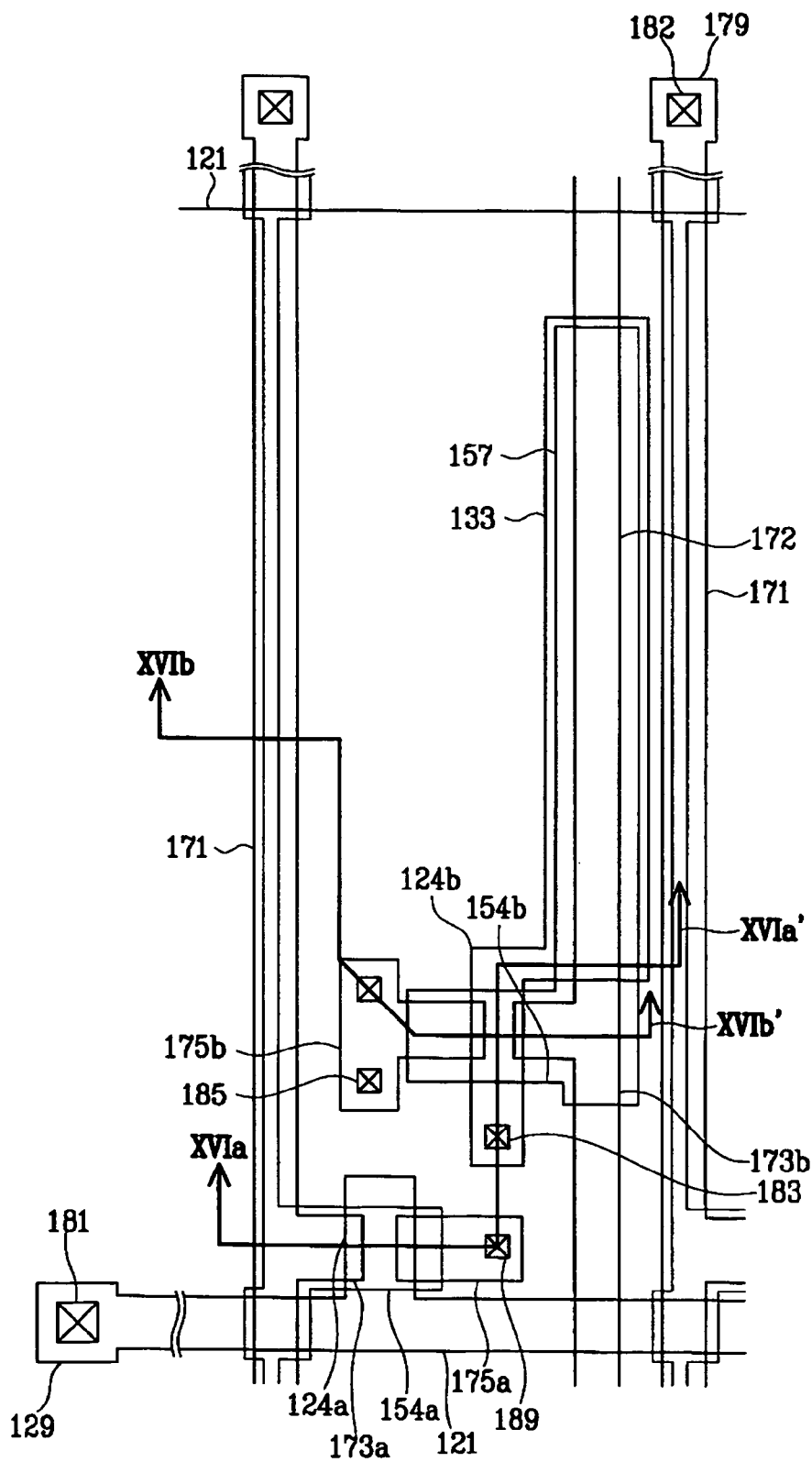
Figure 16A:
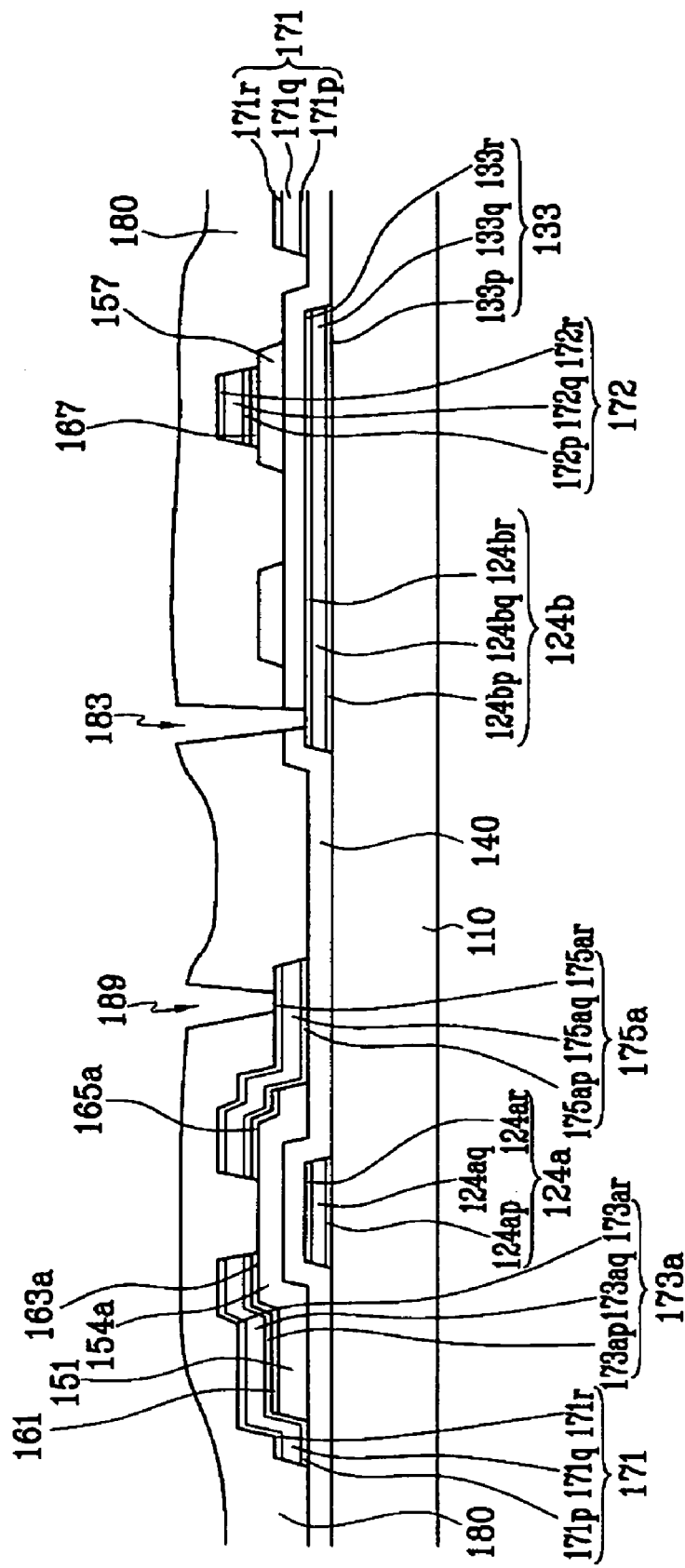
FIGS. 16A and 16B are sectional views of the TFT array panel shown in FIG. 15 taken along the lines XVIa-XVIa' and XVIb-XVIb'.
Figure 16B:
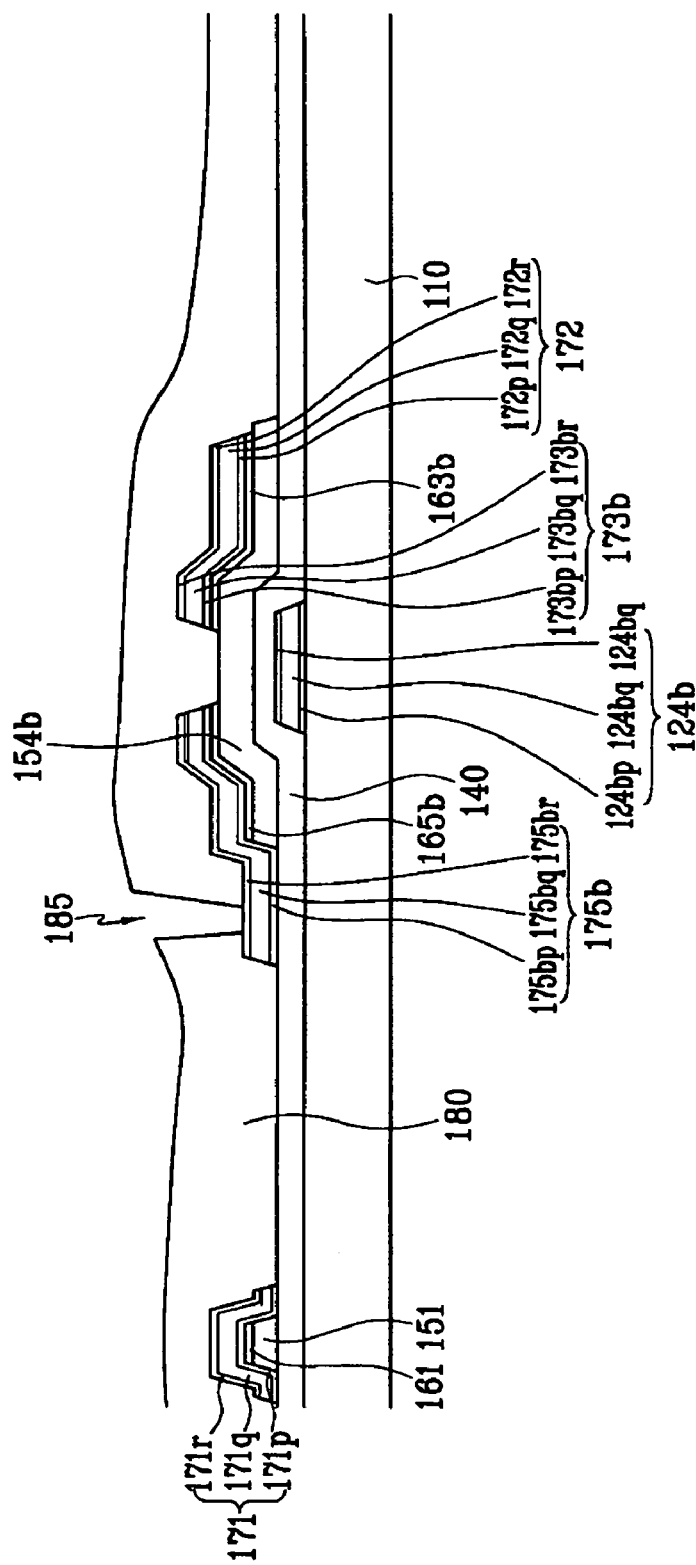

Referring to FIGS. 15 to 16B, a passivation layer 180 is formed of an organic insulating material or an inorganic insulating material. Since this process is performed in a high temperature of over 200° C., the amorphous ITO of the data conductors 171, 172, 175a, and 175b is crystallized.

The passivation layer 180 is patterned to form a plurality of contact holes 189, 185, 183, 181, and 182 exposing the first and second drain electrodes 175a and 175b, the second gate electrodes 124b, an end portion 129 of the gate line 121, and an end portion 179 of the data line 171.

Figure 17:
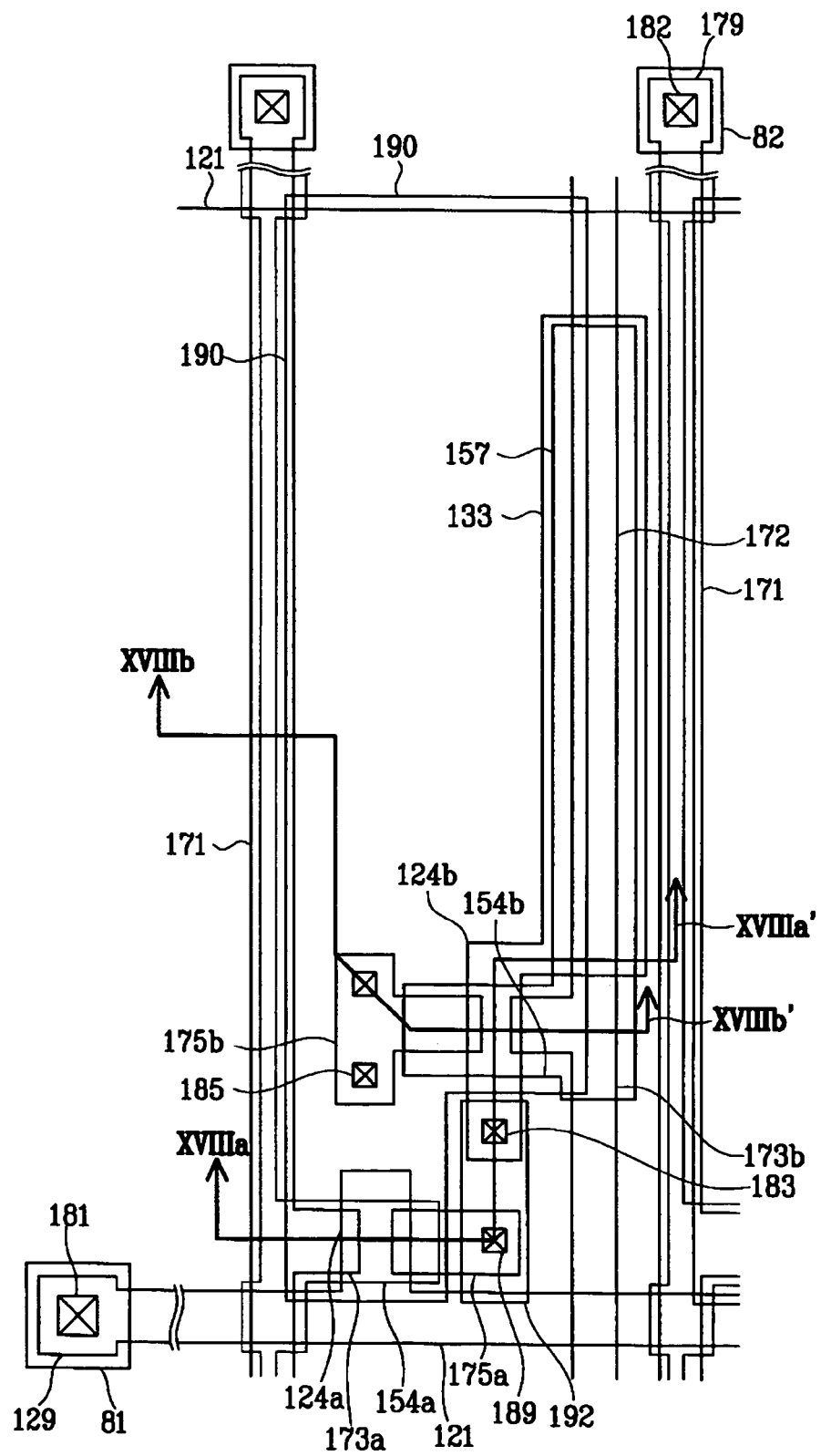
Figure 18A:
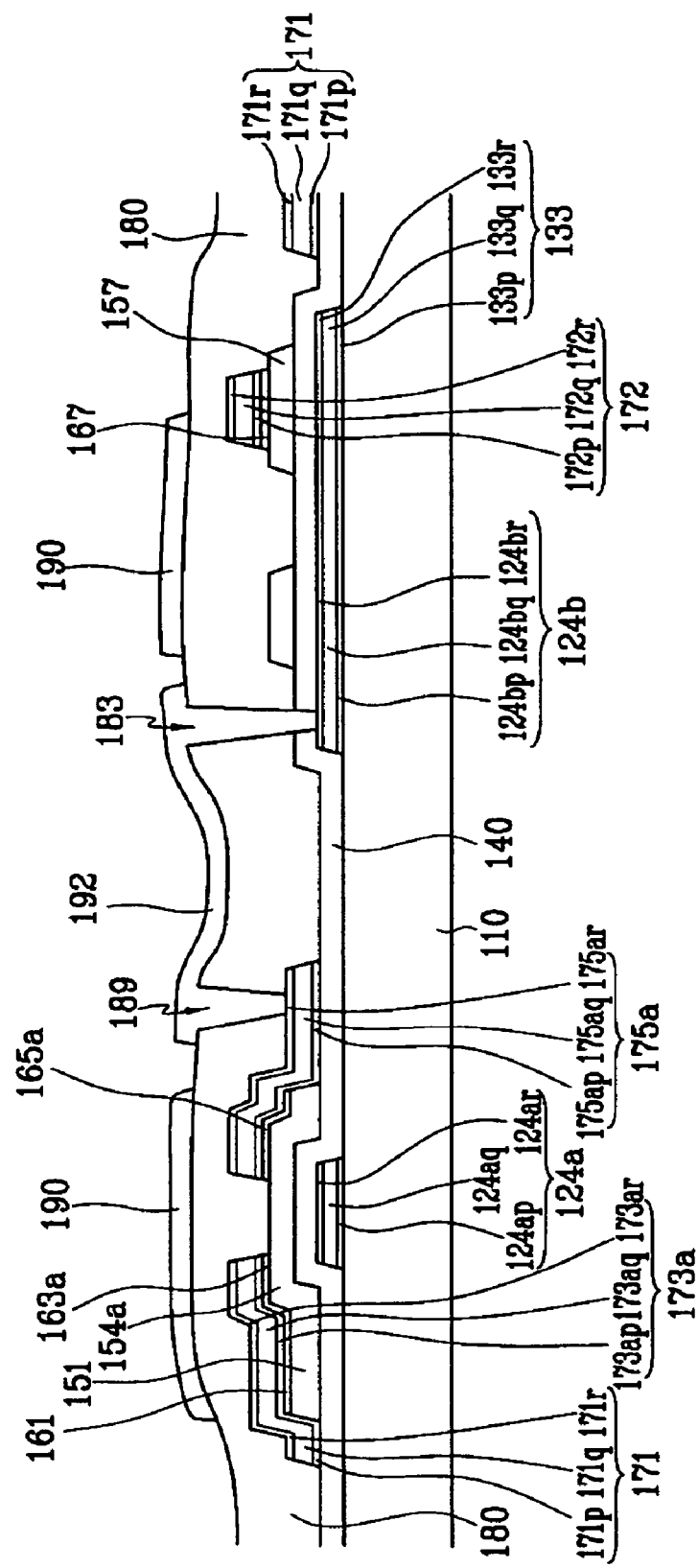
FIGS. 18A and 18B are sectional views of the TFT array panel shown in FIG. 17 taken along the lines XVIIIa-XVIIIa' and XVIIIb-XVIIIb'.
Figure 18B:
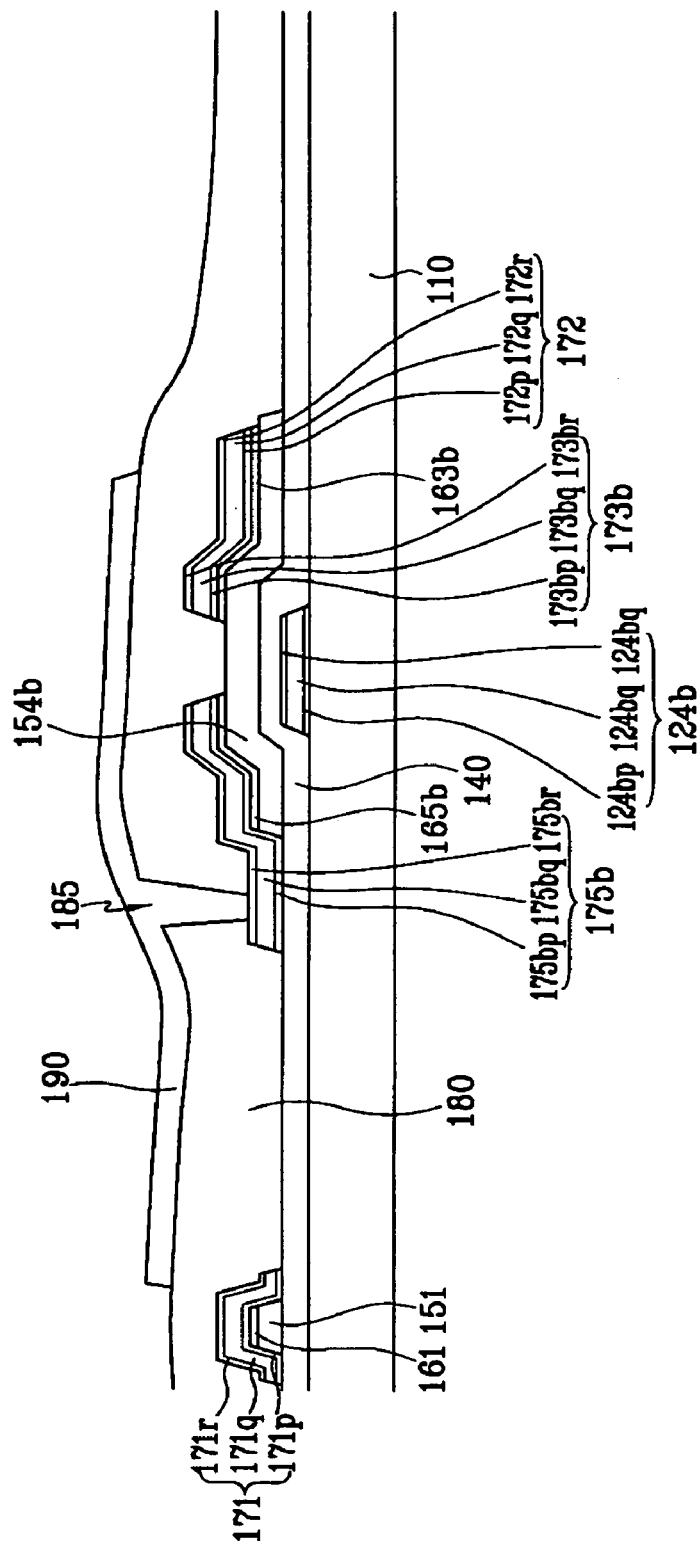

Referring to FIGS. 17 to 18B, a plurality of pixel electrodes 190, a plurality of connecting members 192, and contact assistants 81 and 82 comprising ITO or IZO are formed on the passivation layer 180.

Figure 19:
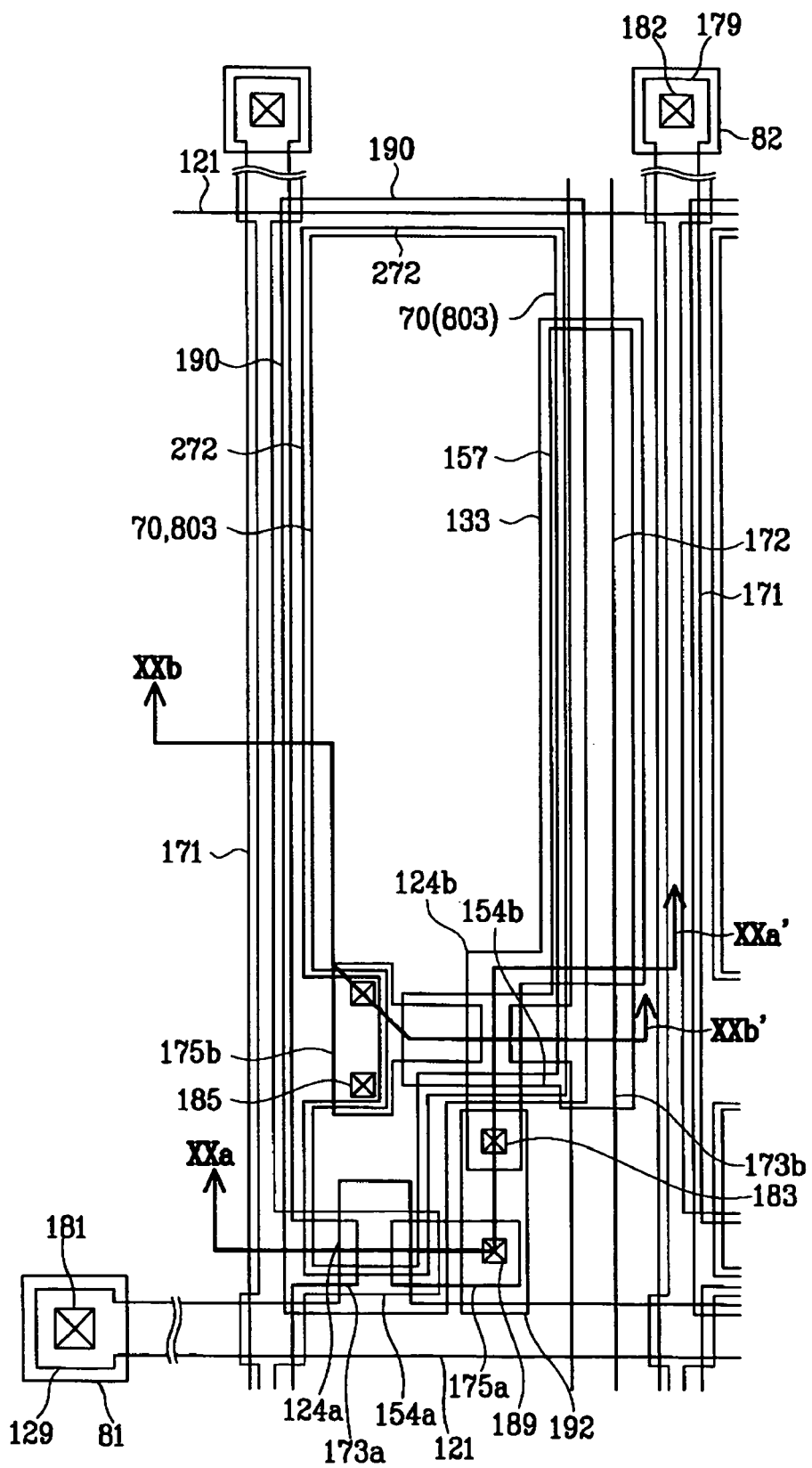

Referring to FIGS. 19-20B, a partition 803 and an auxiliary electrode 272 may be formed using a single photolithography step followed by a single etching step. Finally, a plurality of organic light emitting members 70, preferably comprising multiple layers, are formed in the openings by deposition or inkjet printing following masking, and a common electrode 270 is subsequently formed as shown in FIGS. 21-22B.

In accordance with the present invention, since a conductive oxide layer is disposed between a Cu layer and a substrate, the adhesion between the Cu layer and the substrate and etching efficiency is enhanced. In addition, the conductive oxide layer prevents diffusion of the Cu to another layer. Accordingly, reliability of the signal lines is improved.

In the present embodiment, ITO is the primary conductive oxide, but another conductive oxide such as IZO may also be applied as a conductive oxide of the present invention.

In the present embodiment, conductive oxide layers are disposed on lower and upper sides of a Cu layer. However, one of the upper and lower conductive oxide layers may be omitted.

Although preferred embodiments of the present invention have been described in detail hereinabove, it should be clearly understood that many variations and/or modifications of the basic inventive concepts herein taught, which may appear to those skilled in the present art, will still fall within the spirit and scope of the present invention, as defined in the appended claims.

What is claimed is:

1. A thin film transistor array panel comprising:
an insulating substrate;
a gate line formed on the insulating substrate;
a gate insulating layer formed on the gate line;
a drain electrode and a data line having a source electrode formed on the gate insulating layer, the drain electrode being adjacent to the source electrode with a gap therebetween; and
a pixel electrode coupled to the drain electrode,
wherein at least one of the gate line, the data line, and the drain electrode comprises a first layer comprising a conductive oxide, a second layer formed on the first layer and comprising copper (Cu), and a third layer formed on the second layer and comprising a conductive oxide, and the second layer is thicker than the first layer,
wherein the first layer or the third layer is an amorphous oxide.

2. The thin film transistor array panel of claim 1, wherein the first layer comprises at least one of a-ITO, a-ITON, a-IZO, and a-IZON.

3. The thin film transistor array panel of claim 1, wherein the third layer comprises at least one of a-ITO, a-ITON, a-IZO, and a-TZON.

4. The thin film transistor array panel of claim 1, wherein the first layer and the third layer each comprises at least one of a-ITO, a-ITON, a-IZO, and a-IZON.

5. A thin film transistor array panel comprising:
an insulating substrate;
a gate line formed on the insulating substrate;
a gate insulating layer formed on the gate line;
a drain electrode and a data line having a source electrode formed on the gate insulating layer, the drain electrode being adjacent to the source electrode with a gap therebetween; and
a pixel electrode coupled to the drain electrode,
wherein at least one of the gate line, the data line, and the drain electrode comprises a first layer comprising IZO, IZON, or an amorphous conductive oxide and a second layer comprising copper (Cu), and
the second layer is disposed on or under the first layer and is thicker than the first layer.

6. The thin film transistor array panel of claim 5, wherein the amorphous conductive oxide is a-ITO or a-ITON.

7. The thin film transistor array panel of claim 5, further comprising a third layer facing the first layer with reference to the second layer.

8. The thin film transistor array panel of claim 7, wherein the third layer comprises ITO, IZO, ITON, IZON, or an amorphous conductive oxide.

9. The thin film transistor array panel of claim 8, wherein the amorphous conductive oxide is a-ITO or a-ITON.

* * * * *